(12) United States Patent  
Noguchi et al.

(10) Patent No.: US 8,604,517 B2  
(45) Date of Patent: Dec. 10, 2013

(54) NON-VOLATILE SEMICONDUCTOR MEMORY DEVICE FOR SUPPRESSING DETERIORATION IN JUNCTION BREAKDOWN VOLTAGE AND SURFACE BREAKDOWN VOLTAGE OF TRANSISTOR

(75) Inventors: Mitsuhiro Noguchi, Yokohama (JP);  
Hiroyuki Kutsukake, Yokohama (JP);  
Masato Endo, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 257 days.

(21) Appl. No.: 13/234,613

(22) Filed: Sep. 16, 2011

(65) Prior Publication Data

US 2012/0199896 A1 Aug. 9, 2012

(30) Foreign Application Priority Data

Feb. 4, 2011 (JP) ................................. 2011-023215

(51) Int. Cl.  
*H01L 29/66* (2006.01)

(52) U.S. Cl.  
USPC ......................................................... 257/192

(58) Field of Classification Search  
USPC ......................................................... 257/192  
See application file for complete search history.

(56) References Cited

U.S. PATENT DOCUMENTS

| 7,245,534 B2 | 7/2007 | Goda et al. |
| 7,872,289 B2 | 1/2011 | Noguchi et al. |
| 2006/0273388 A1 * | 12/2006 | Yamazaki ..................... 257/330 |

FOREIGN PATENT DOCUMENTS

| JP | 2957283 | 7/1999 |
| JP | 3161435 | 2/2001 |
| JP | 4113199 | 4/2008 |

* cited by examiner

*Primary Examiner* — Jae Lee  
(74) *Attorney, Agent, or Firm* — Oblon, Spivak, McClelland, Maier & Neustadt, L.L.P.

(57) ABSTRACT

According to one embodiment, a non-volatile semiconductor memory device includes a plurality of memory cells and a transistor. The transistor includes a gate insulating film, a gate electrode on the gate insulating film, a sidewall insulating film on both side surfaces of the gate electrode, a source diffusion layer corresponding to the sidewall insulating film, a first hollow formed in a position at a height less than a bottom surface of the gate insulating film directly below an outer side surface of the sidewall insulating film of another side of the gate electrode, a second hollow formed in the first hollow at a position at a height less than the first hollow, and a drain diffusion layer corresponding to another side of the gate electrode and including a low-concentration drain region formed on a bottom surface of the second hollow and a high-concentration drain region.

10 Claims, 29 Drawing Sheets

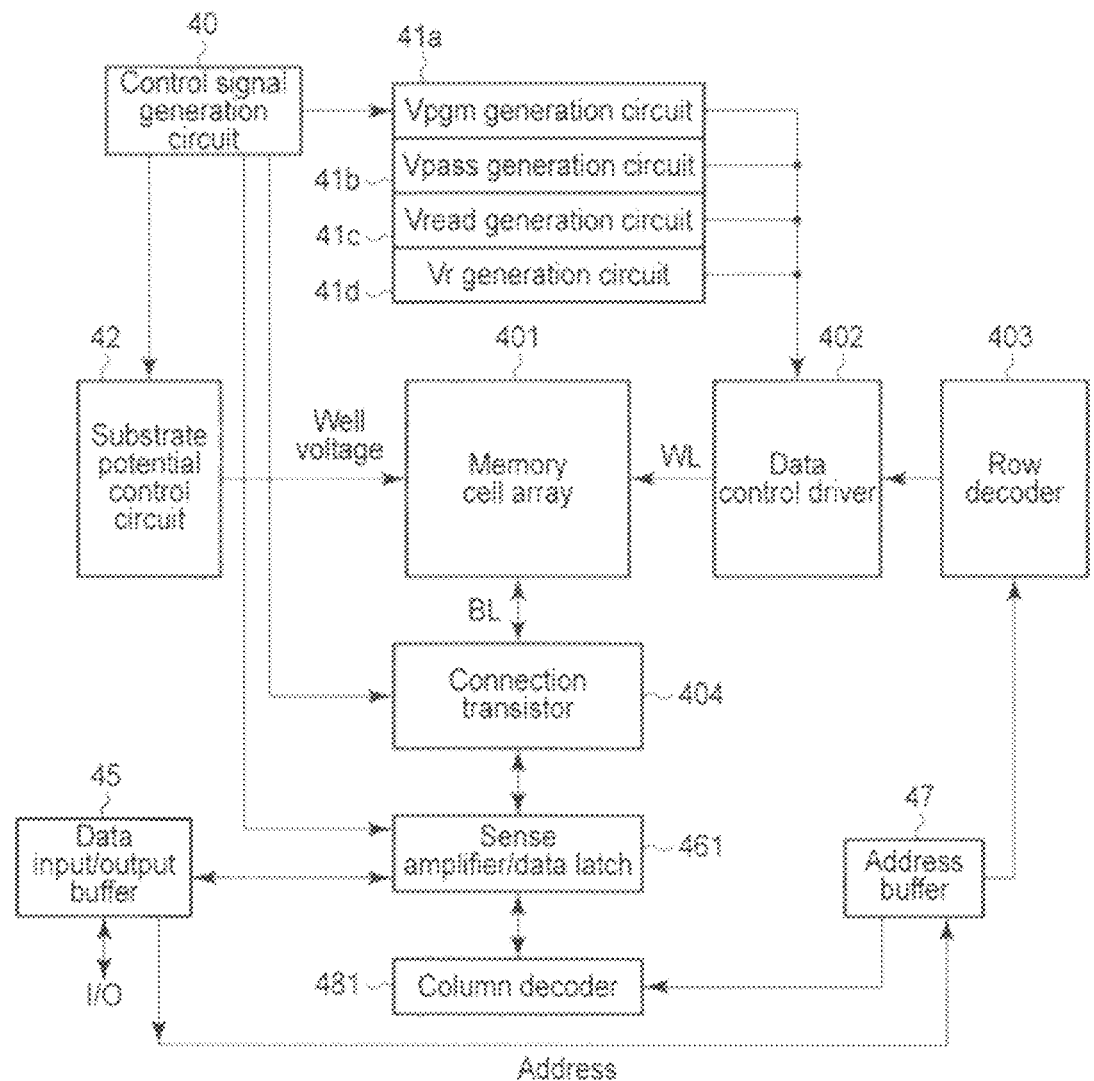
F I G. 1

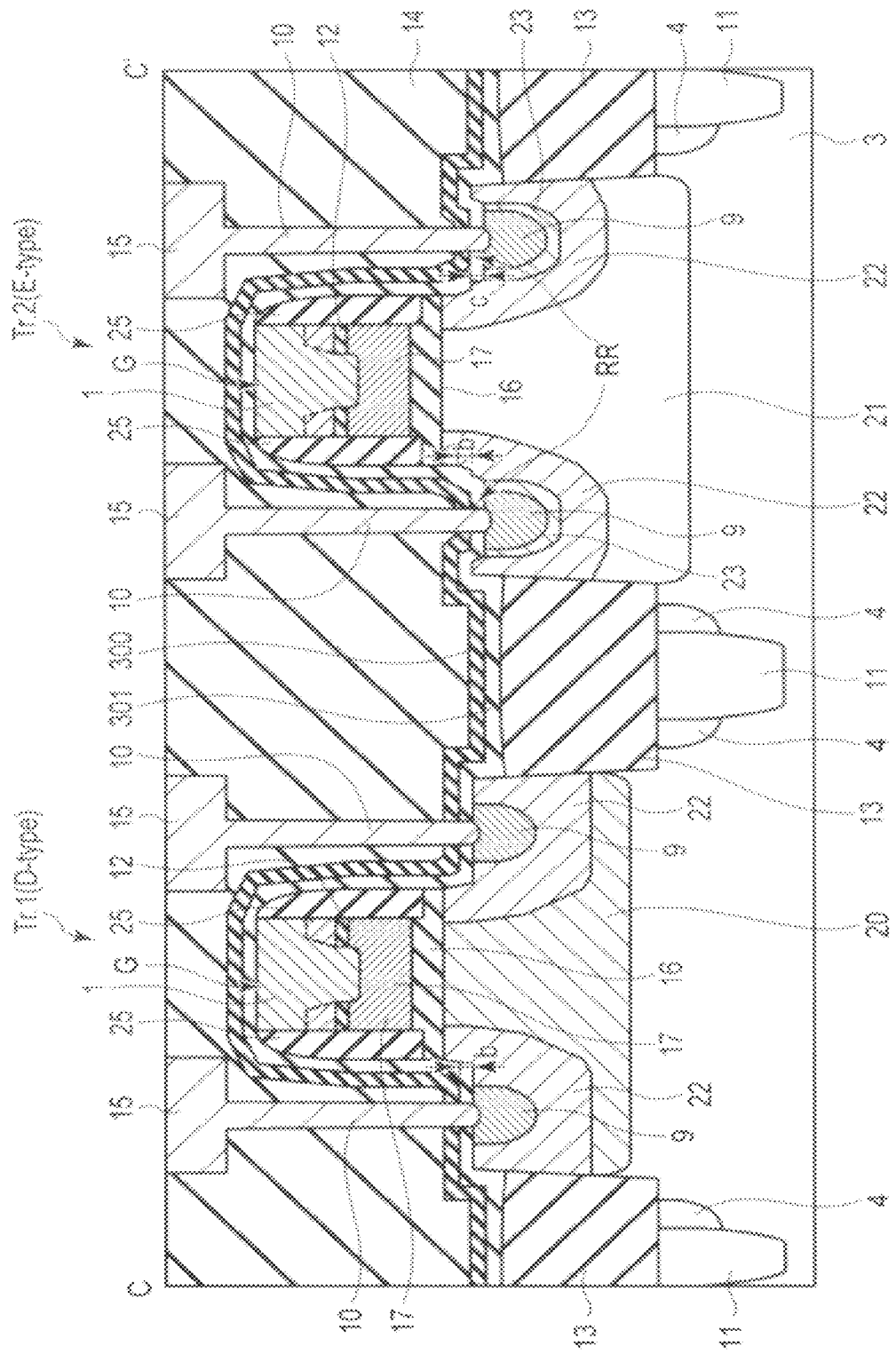
F I G. 13

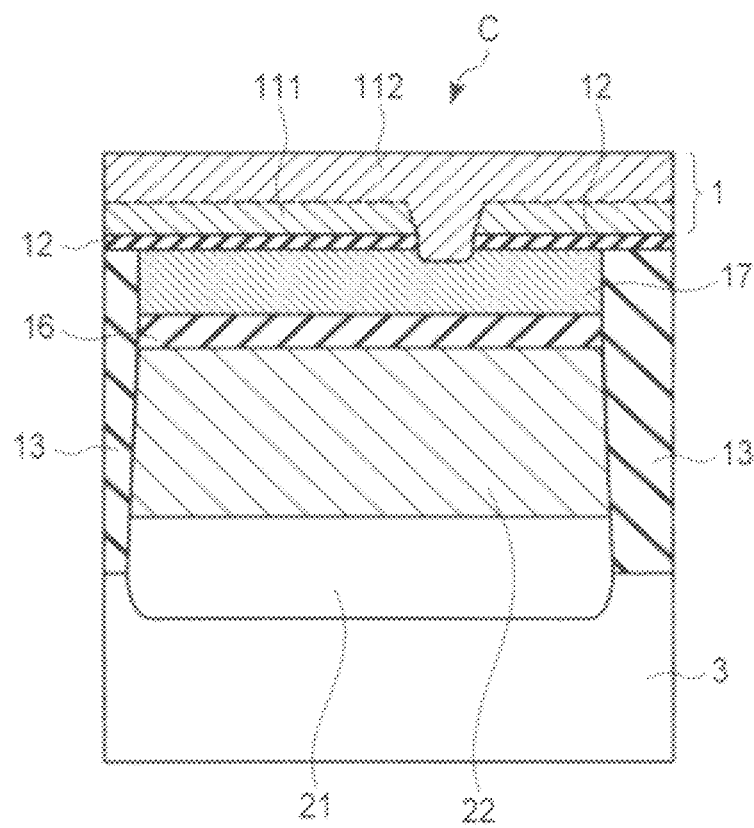
F I G. 21

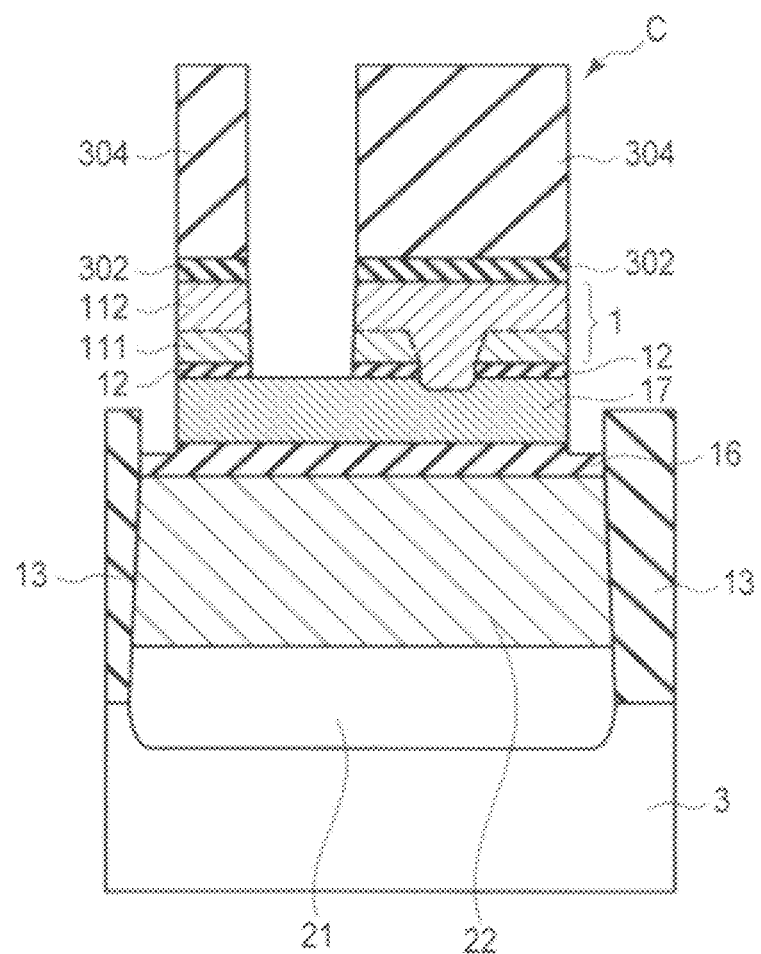
F I G. 27

NON-VOLATILE SEMICONDUCTOR MEMORY DEVICE FOR SUPPRESSING DETERIORATION IN JUNCTION BREAKDOWN VOLTAGE AND SURFACE BREAKDOWN VOLTAGE OF TRANSISTOR

CROSS-REFERENCE TO RELATED APPLICATIONS

This application is based upon and claims the benefit of priority from prior Japanese Patent Application No. 2011-023215, filed Feb. 4, 2011, the entire contents of which are incorporated herein by reference.

FIELD

Embodiments described herein relate generally to non-volatile semiconductor memory devices, and, in particular, to a NAND flash memory, for example.

BACKGROUND

NAND flash memories comprising a NAND cell unit formed by connecting a plurality of EEPROMs in series have been developed. In a NAND flash memory, a plurality of memory cells are simultaneously erased, so as to increase the number of memory cells that are erased in a unit of time, for example. Accordingly, by applying a positive voltage of greater than or equal to 10 V, more specifically, 20 V, for example, to a well region in which a memory cell is formed, electrons are extracted from a charge accumulation layer to a substrate.

During data writing, on the other hand, by keeping the voltage of the well region at 0 V and applying a positive voltage of greater than or equal to 10 V to a source/drain diffusion layer of a memory cell having a charge/discharge capacitance smaller than that of the well region, it is possible to reduce electric power required to charge and discharge the well region, and thereby enhance the operation speed.

Since a positive voltage of 20 V needs to be applied to a control gate electrode of the memory cell, a high-voltage transistor including a gate insulating film greater in thickness than a tunnel insulating film is employed, so as to transfer the voltage to the control gate electrode.

In conventional high-voltage transistors, the concentration of a lightly doped drain (LDD) area differs between a depletion-type (D-type) high-voltage transistor and an enhanced-type (E-type) high-voltage transistor. In this configuration, it is difficult to optimize junction breakdown voltage and surface breakdown voltage in both of the D-type high-voltage transistor and the E-type high-voltage transistor. This causes a problem that reliability of the non-volatile semiconductor memory device decreases due to deterioration in junction breakdown voltage and surface breakdown voltage of the transistors.

BRIEF DESCRIPTION OF THE DRAWINGS

FIG. 1 is a block diagram schematically illustrating a NAND non-volatile semiconductor memory device to which the present embodiment is applied.

FIG. 13 is a cross-sectional view taken along line C-C' of FIG. 10.

FIG. 21 is a cross-sectional view illustrating a capacitive element formed by a step similar to that of a transistor.

FIG. 27 is a cross-sectional view illustrating a manufacturing step following FIG. 24.

DETAILED DESCRIPTION

Figure 2:
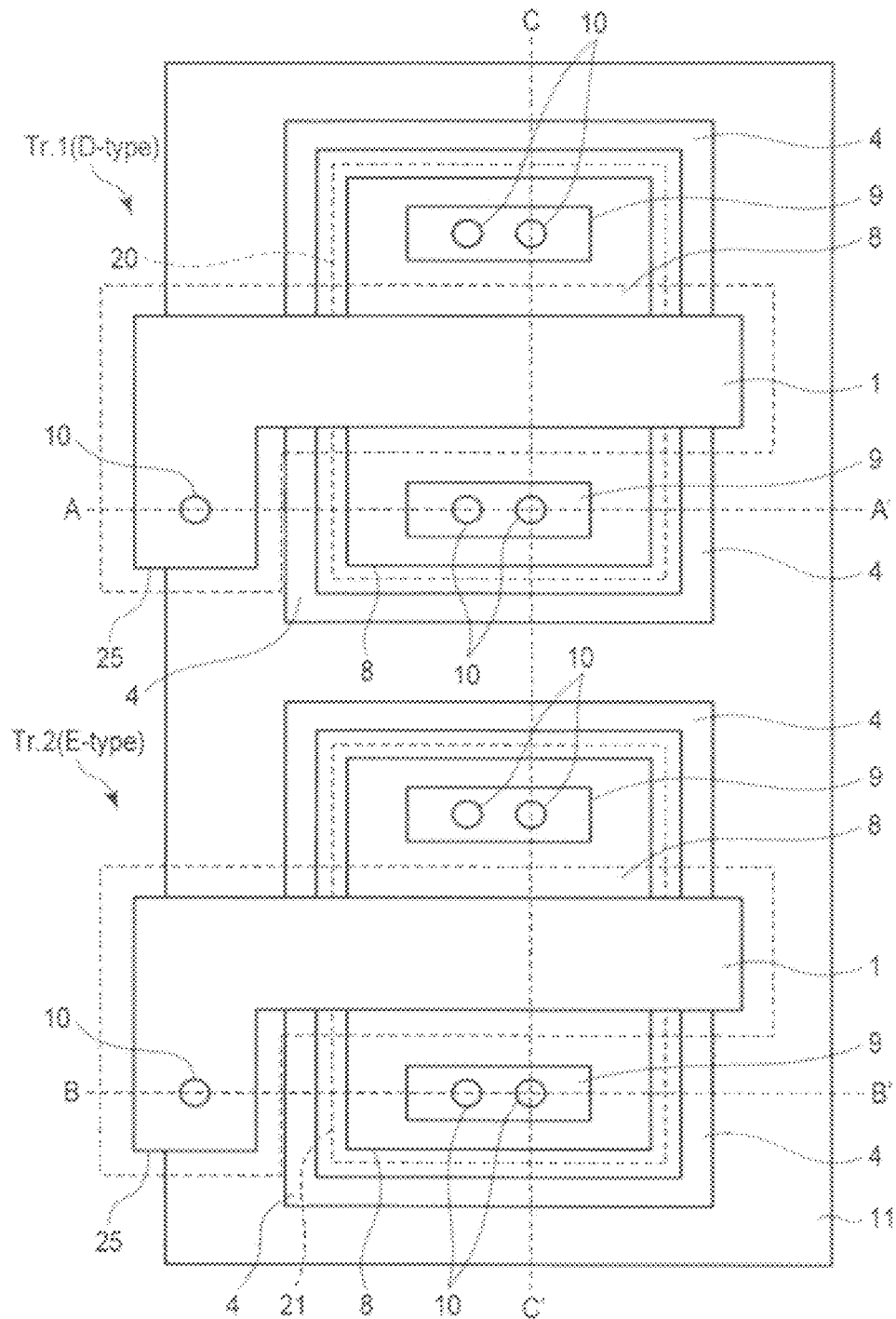
FIG. 2 is a plan view illustrating a general depletion-mode high-voltage transistor and a general enhancement-mode high-voltage transistor.

In general, according to one embodiment, a non-volatile semiconductor memory device comprises a memory cell array and a transistor. The memory cell array includes a plurality of data control lines and a plurality of data transfer lines formed on a semiconductor substrate, and a plurality of memory cells selected by the data control line and the data transfer line. The transistor is formed on the semiconductor substrate, and includes a gate insulating film having a thickness greater than that of a gate insulating film of the memory cell, a gate electrode on the gate insulating film, a sidewall insulating film formed on both side surfaces of the gate electrode, a source diffusion layer formed in a portion of the semiconductor substrate corresponding to one side of the gate electrode and connected to a sense amplifier via a contact, a first hollow formed in a position at a height less than a bottom surface of the gate insulating film directly below an outer side surface of the sidewall insulating film on another side of the gate electrode, a second hollow formed in the first hollow in a position at a height less than the first hollow, and a drain diffusion layer formed in a portion of the semiconductor substrate corresponding to another side of the gate electrode and including a low-concentration drain region formed on a bottom surface of the second hollow and a high-concentration drain region surrounded by the low-concentration drain region and connected to the data transfer line via a contact.

FIG. 1 is a block diagram illustrating a NAND non-volatile semiconductor memory device applied to an embodiment. The NAND non-volatile semiconductor memory device comprises a memory cell array 401, a data control line driver 402, a row decoder 403, a transistor (hereinafter referred to as connection transistor) 404 connecting a data transfer line and a sense amplifier, a sense amplifier/data latch 461, a column decoder 481, a data input/output buffer 45, an address buffer 47, a control signal generation circuit 40, a Vpgm generation circuit 41a, a Vpass generation circuit 41b, a Vread generation circuit 41c, a Vr generation circuit 41d, and a substrate potential control circuit 42.

The memory cell array 401 includes a plurality of memory cells arranged in matrix, and a plurality of memory cells arranged in a column and connected in series to a selective transistor on the source side and a selective transistor on the drain side form a NAND cell unit. A control gate electrode of each of a plurality of memory cells arranged in a row is connected to a corresponding word line which functions as a data control line. The selective transistor on the drain side is connected to a bit line as a data transfer line, and the selective transistor on the source side is connected to a source line. The memory cell in the NAND cell unit is selected by the bit line and the word line.

The word line is selected by the address buffer 47, the row decoder 403, and the data control line driver 402. A potential of the word line is generated by the Vpgm generation circuit 41a, the Vpass generation circuit 41b, the Vread generation circuit 41c, and the Vr generation circuit 41d, based on the operation of the control signal generation circuit 40.

During programming, the Vpgm generation circuit 41a generates a program voltage Vpgm, and the Vpass generation circuit 41b generates a voltage Vpass, which causes the written cell to conduct. During data reading, the Vr generation circuit 41d generates a read voltage Vr, and the Vread generation circuit 41c generates a voltage Vread, which turns on a memory cell with the highest threshold voltage. The above-described voltages are supplied to the data control line driver 402. Further, the substrate potential control circuit 42 generates a well voltage of the memory cell array 401.

A bit line functions as a data transfer line. A bit line of the memory cell array 401 is selected by the address buffer 47 and the column decoder 481, and a potential of the bit line is controlled according to data supplied from the data input/output buffer 45 via the sense amplifier/data latch 461 and the connection transistor 404. The sense amplifier/data latch 461 and the connection transistor 404 control writing and reading of data, according to a control signal supplied from the control signal generation circuit 40.

In FIG. 1, the data control line driver 402, the row decoder 403, the connection transistor 404, and the substrate potential control circuit 42, for example, are formed of a high-voltage transistor.

Examples of high-voltage transistors used in a NAND flash memory include at least the following two types: depletion-mode high-voltage transistor (hereinafter referred to as D-type high-voltage transistor) having a negative threshold voltage of −4 to 0 V; and enhancement-mode transistor (hereinafter referred to as E-type high-voltage transistor) having a positive threshold voltage. Even if a voltage equal to the gate electrode voltage is applied to one of the source and drain electrodes, for example, a D-type high-voltage transistor is capable of transferring the voltage to the other of the source and drain electrodes, without causing a positive voltage drop by an amount equivalent to that of the threshold voltage.

Since the potential of the gate electrode thus does not need to be higher than the potential of the source and drain electrodes when the transistor turns on, D-type high-voltage transistors are widely used as voltage transfer circuits, for example, such as the row decoder 403.

On the other hand, E-type high-voltage transistors are widely used in the data control line driver 402, the connection transistor 404, or peripheral circuits thereof, so as to electrically separate two source and drain terminals while 0 V is applied to the gate electrode.

FIG. 2 is a plan view illustrating a general D-type high-voltage transistor Tr.1 and a general E-type high-voltage transistor Tr.2. For the sake of clarity in understanding, in FIG. 2, only a plane configuration of structural elements at a height less than a contact 10 is shown, and an interconnect layer is not shown.

Figure 3:
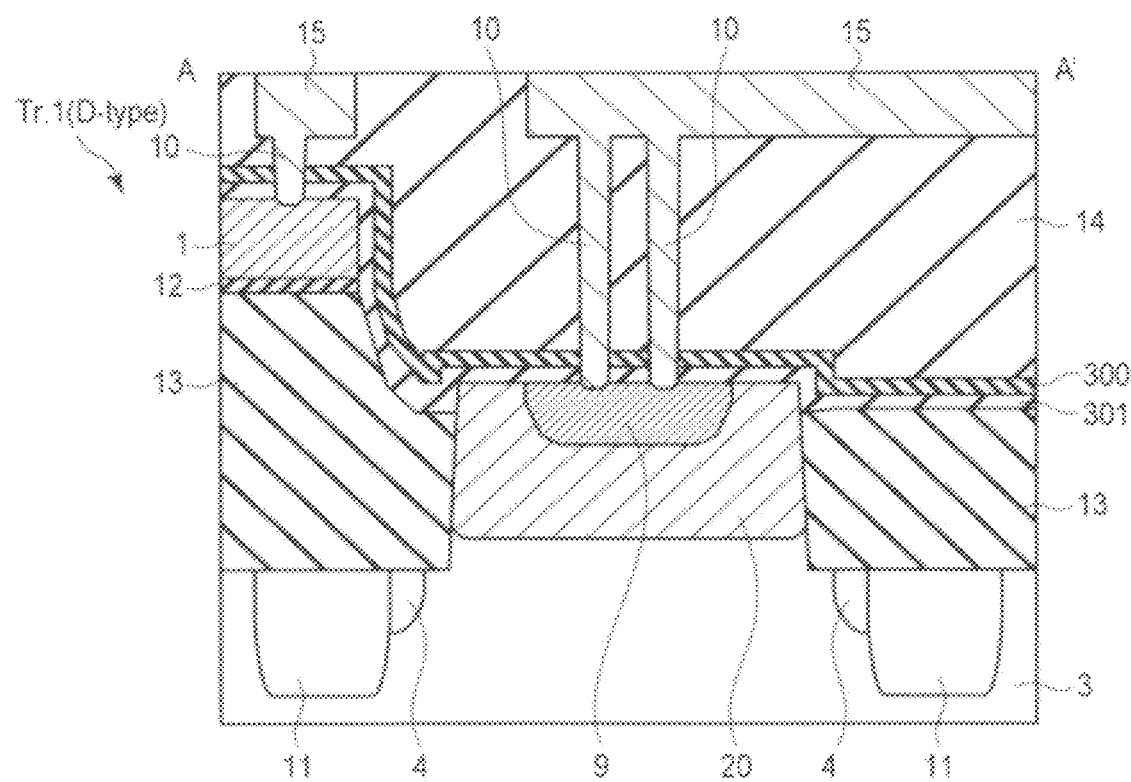
FIG. 3 is a cross-sectional view taken along line A-A' of FIG. 2.
Figure 4:
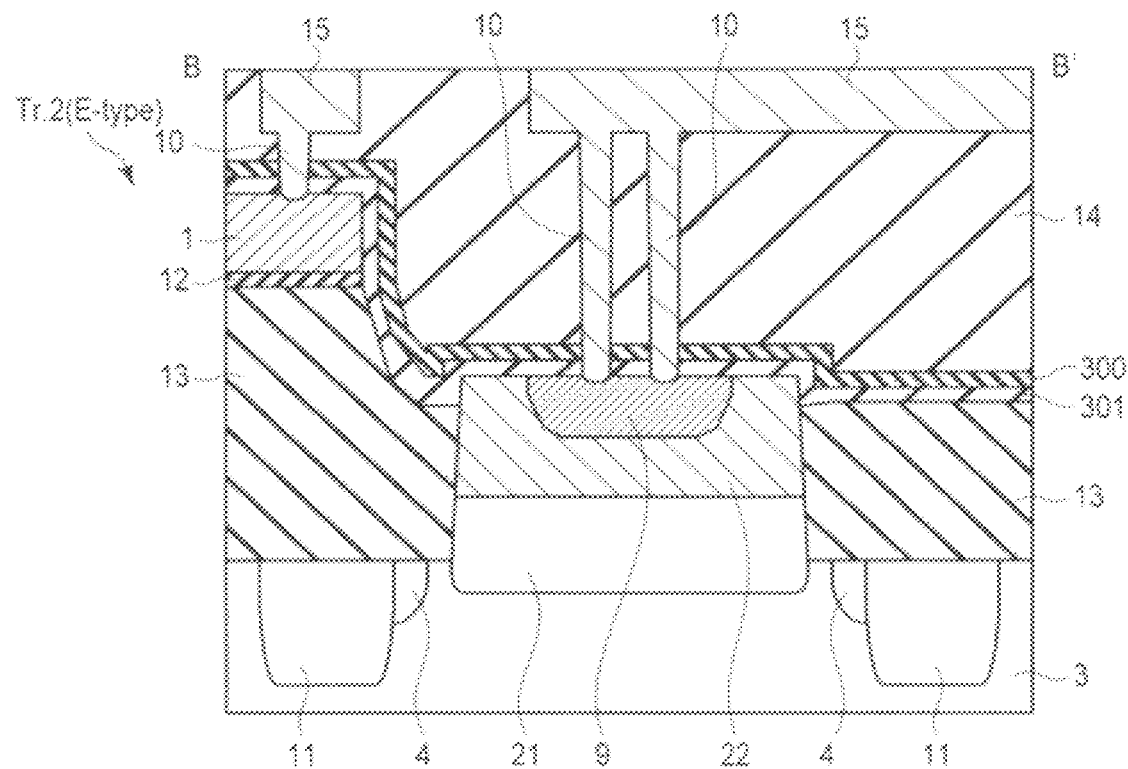
FIG. 4 is a cross-sectional view taken along line B-B' of FIG. 2.
Figure 5:
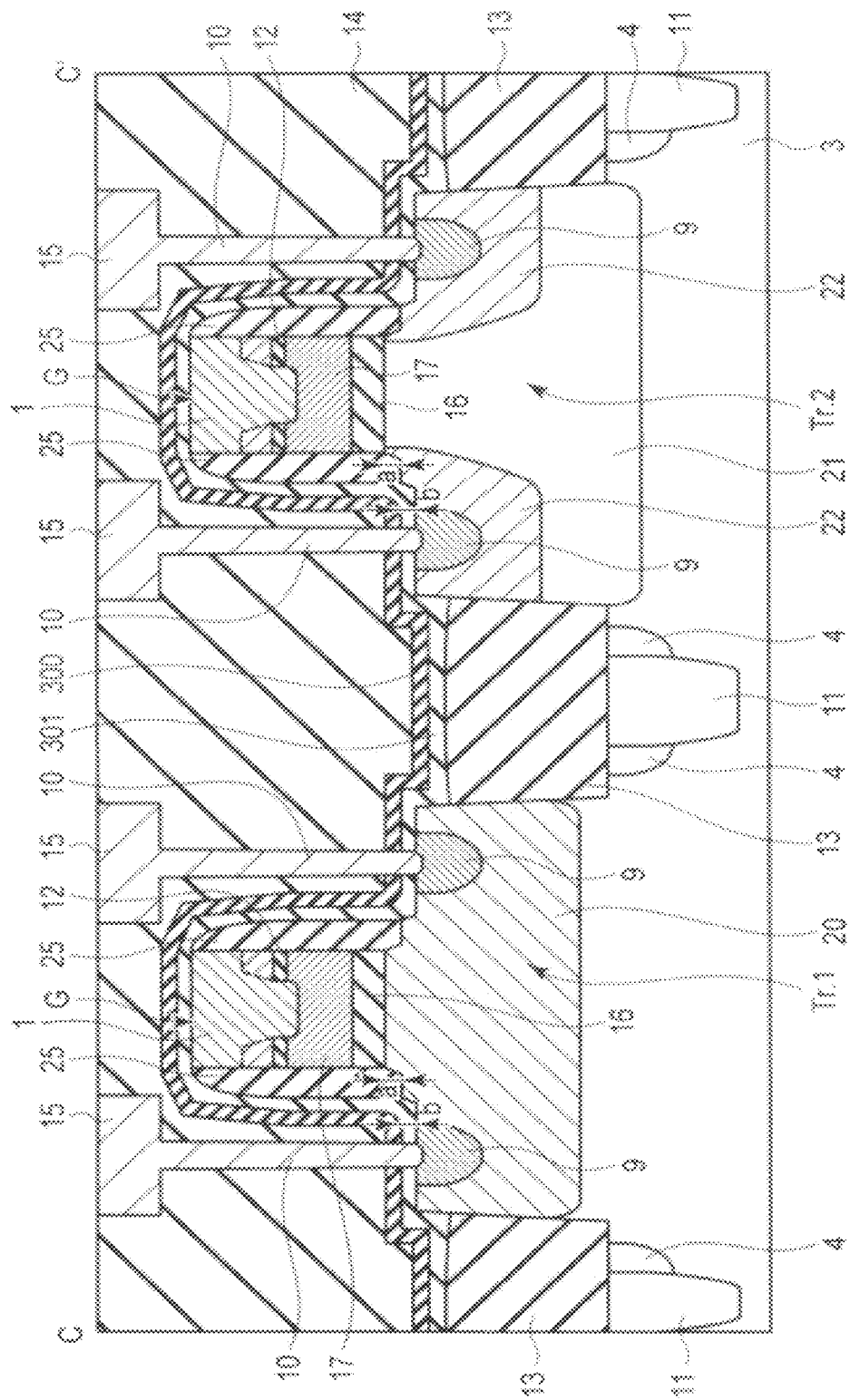
FIG. 5 is a cross-sectional view taken along line C-C' of FIG. 2.

FIG. 3 is a cross-sectional view taken along line A-A' of FIG. 2, FIG. 4 is a cross-sectional view taken along line B-B' of FIG. 2, and FIG. 5 is a cross-sectional view taken along line C-C' of FIG. 2. The same reference numbers are used to refer to the same structural elements throughout the drawings.

In FIG. 5, the reference number 3 denotes a p-type semiconductor substrate in which a p-type impurity concentration is set within the range of $10^{14}$ to $10^{15}$ $cm^{-3}$, the reference number 10 denotes a contact to an interconnect layer 15, the reference number 9 denotes a high-concentration N+ diffusion layer having an N-type impurity concentration of greater than $10^{19}$ $cm^{-3}$ and less than $10^{23}$ $cm^{-3}$, the reference number 20 denotes a D-type impurity region to which n-type impurities having a concentration of $10^{15}$ to $10^{17}$ $cm^{-3}$, for example, are added, the reference number 22 denotes a source/drain lightly doped drain (LDD) region to which n-type impurities having a concentration of $10^{17}$ to $10^{19}$ $cm^{-3}$, for example, are added, and the reference number 21 denotes a region to which p-type impurities having a concentration greater than that of the substrate 3, on the order of $10^{16}$ to $10^{18}$ $cm^{-3}$, for example, are added.

Further, the reference number 16 denotes a gate insulating film of a high-voltage transistor, the reference number 17 denotes a floating gate electrode formed of polycrystalline silicon to which phosphorous, for example, is implanted, the reference number 12 denotes a block insulating film (inter-gate insulating film), and the reference number 1 denotes a control gate electrode. The film thickness of the gate insulating film 16 is set to be greater than that of the gate insulating film of the memory cell transistor.

When D- and E-type high-voltage transistors Tr.1 and Tr.2 are formed, the gate insulating film 16, the floating gate electrode 17, the inter-poly insulating film 12, and the control gate electrode 1 are sequentially stacked, and are etched simultaneously by means of anisotropic etching. In this case, by etching the semiconductor substrate 1 formed of silicon, for example, by 1 to 10 nm, for example, a step height is formed in the periphery of the gate electrode structure. This step height is shown as "a" in FIG. 5.

The reference number 25 denotes a sidewall insulating film formed of a silicon oxide film, for example. By forming a silicon oxide film, for example, on a gate electrode structure and etching the silicon oxide film by means of anisotropic etching, the sidewall insulating film 25 is selectively left on the sidewall of the gate electrode structure. In this case, a step height is generated when the semiconductor substrate 3 formed of silicon is etched by 1 to 10 nm, for example. This step height is shown in FIG. 5 as "b".

Thus, two step heights as shown in FIG. 5 are formed on the semiconductor substrate 3. Since D- and E-type high-voltage transistors Tr.1 and Tr.2 are processed simultaneously, two step heights are also formed on the semiconductor substrate 3, on which E-type high-voltage transistor Tr.2 is to be formed.

After that, n-type impurities such as phosphorus and arsenic, for example, are implanted into the substrate 3, at a peak concentration of $10^{17}$ to $10^{19}$ cm$^{-3}$, which will be the lightly doped drain (LDD) region 22 of the source/drain electrode.

The contact region of the interconnect and the high-concentration N$^+$ diffusion layer 9 as a source/drain are formed by implanting n-type impurities at a peak concentration of $10^{19}$ to $10^{21}$ cm$^{-3}$. As a result thereof, the LDD region 22 becomes an n-type region formed in a region extending from an end of the high-concentration N$^+$ diffusion layer 9 to an end of the gate electrode. The LDD region of D-type high-voltage transistor Tr.1 is formed as D-type impurities 20. Further, the LDD region 22 of D- or E-type high-voltage transistor Tr.2 is formed in the E-type impurity region 21. Accordingly, the sheet resistance of the LDD region 22 of E-type high-voltage transistor Tr.2 becomes greater than the sheet resistance of the LDD region of D-type high-voltage transistor Tr.1.

Since the sheet resistance of the LDD region 22 differs between D- and E-type high-voltage transistors Tr.1 and Tr.2, the optimum values for the junction breakdown voltage and the surface breakdown voltage of the transistors differ. Conventionally, in order to decrease the resistance of the source/drain layer of E-type high-voltage transistor Tr.2, P or As impurities need to be injected.

Further, in order to reduce the area of the data control line driver 402 and the row decoder 403 formed of E-type high-voltage transistor Tr.2, for example, p-type impurities, such as boron, need to be HALO-implanted at a concentration of $10^{16}$ to $10^{18}$ cm$^{-3}$.

Since additional ion implantation thus needs to be performed only on E-type high-voltage transistor Tr.2, so as to make the concentration of the LDD region 22 of E-type high-voltage transistor Tr.2 appropriate, a problem arises that the number of lithography steps increases.

In addition, when additional ion implantation is not performed, a problem arises that reliability is decreased due to deterioration in junction breakdown voltage or surface breakdown voltage of the transistors.

In particular, it is difficult to maintain high reliability of an E-type high-voltage transistor including a transistor with a narrow channel width, in which the junction breakdown voltage and the surface breakdown voltage of the transistor decrease more easily.

In FIGS. 3 to 5, the reference number 13 denotes an element isolation insulating film as an element isolation (shallow trench isolation [STI]) region, the reference numbers 4, 11 denote a punch-through stopper (channel stopper), and the reference numbers 301, 300, 14 denote insulating films.

Figure 6:
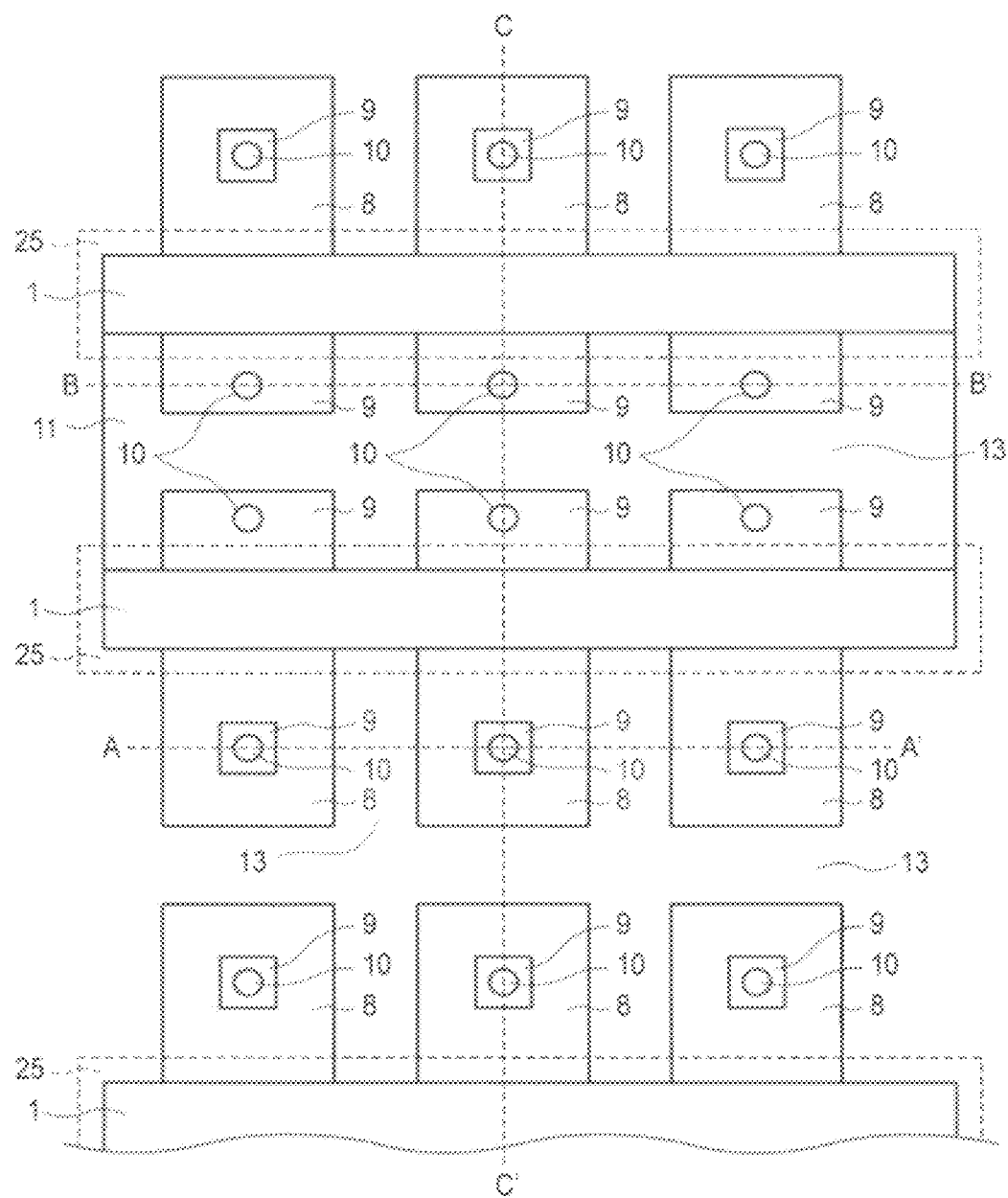
FIG. 6 is a plan view illustrating an enhancement-mode transistor applied to a transistor configured to connect a data transfer line and a sense amplifier.
Figure 7:
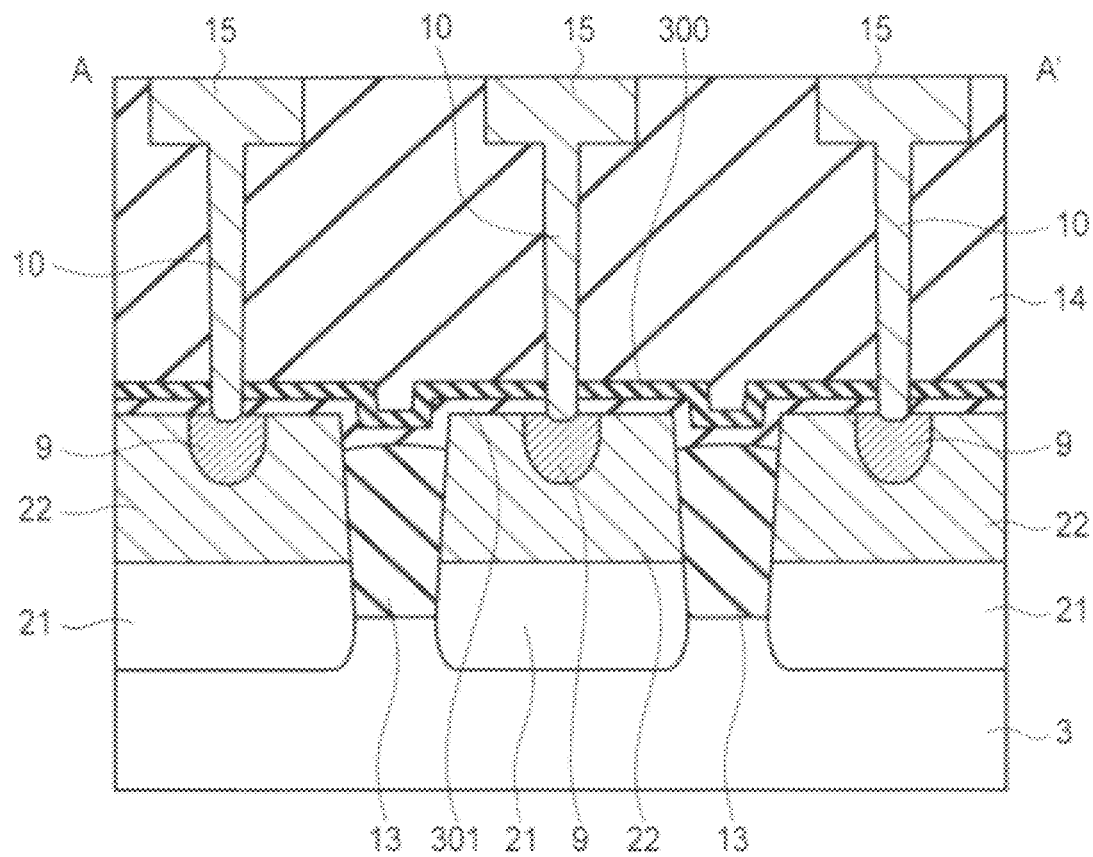
FIG. 7 is a cross-sectional view taken along line A-A' of FIG. 6.

FIG. 6 shows a plan view of E-type high-voltage transistor Tr.3 applied to the connection transistor 404, for example. For the sake of clarity in understanding, in FIG. 6, only a plane configuration of structural elements smaller in height than a contact 10 is shown and the interconnect layer is not shown. FIG. 7 shows a cross section taken along line A-A' of FIG. 6, and FIG. 8 shows a cross section taken along line B-B' of FIG. 6.

Figure 8:
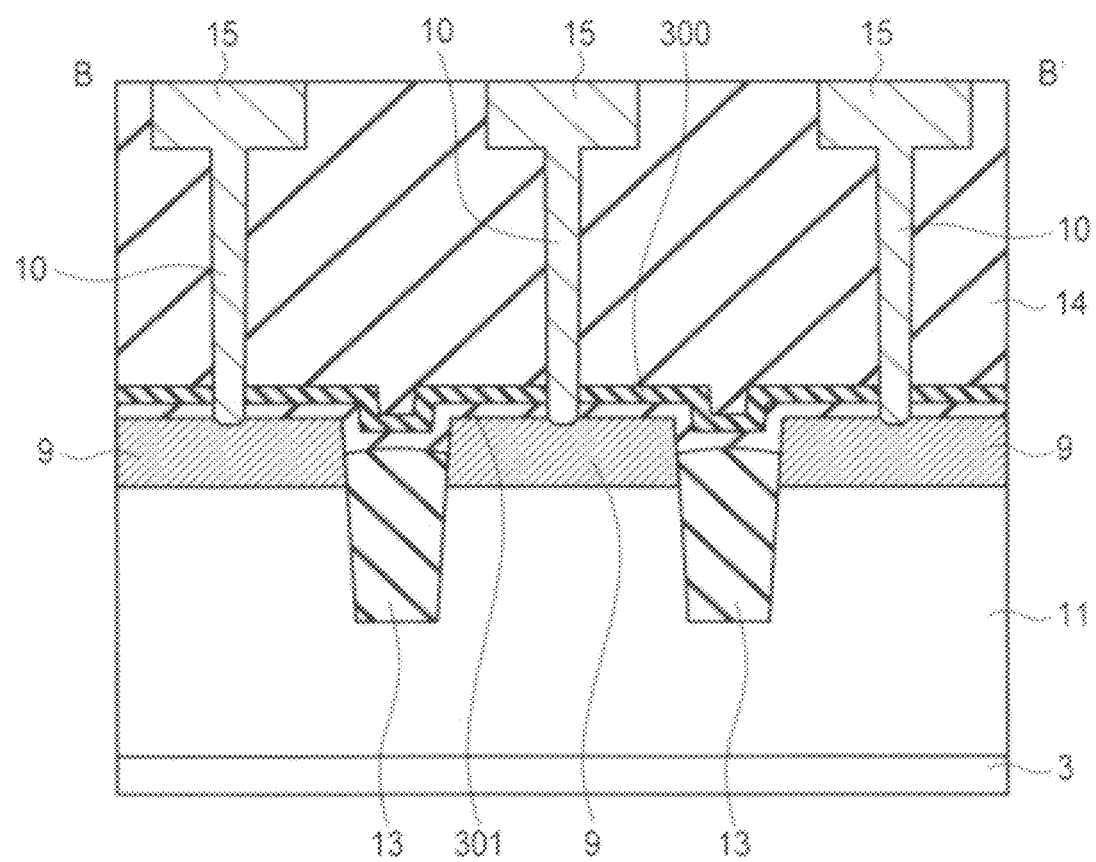
FIG. 8 is a cross-sectional view taken along line B-B' of FIG. 6.

The contact 10 shown in FIG. 7 is connected to a data transfer line (BL) 15 connected to a memory cell, and the contact 10 shown in FIG. 8 is connected to an interconnect 15 connected to a sense amplifier.

Figure 9:
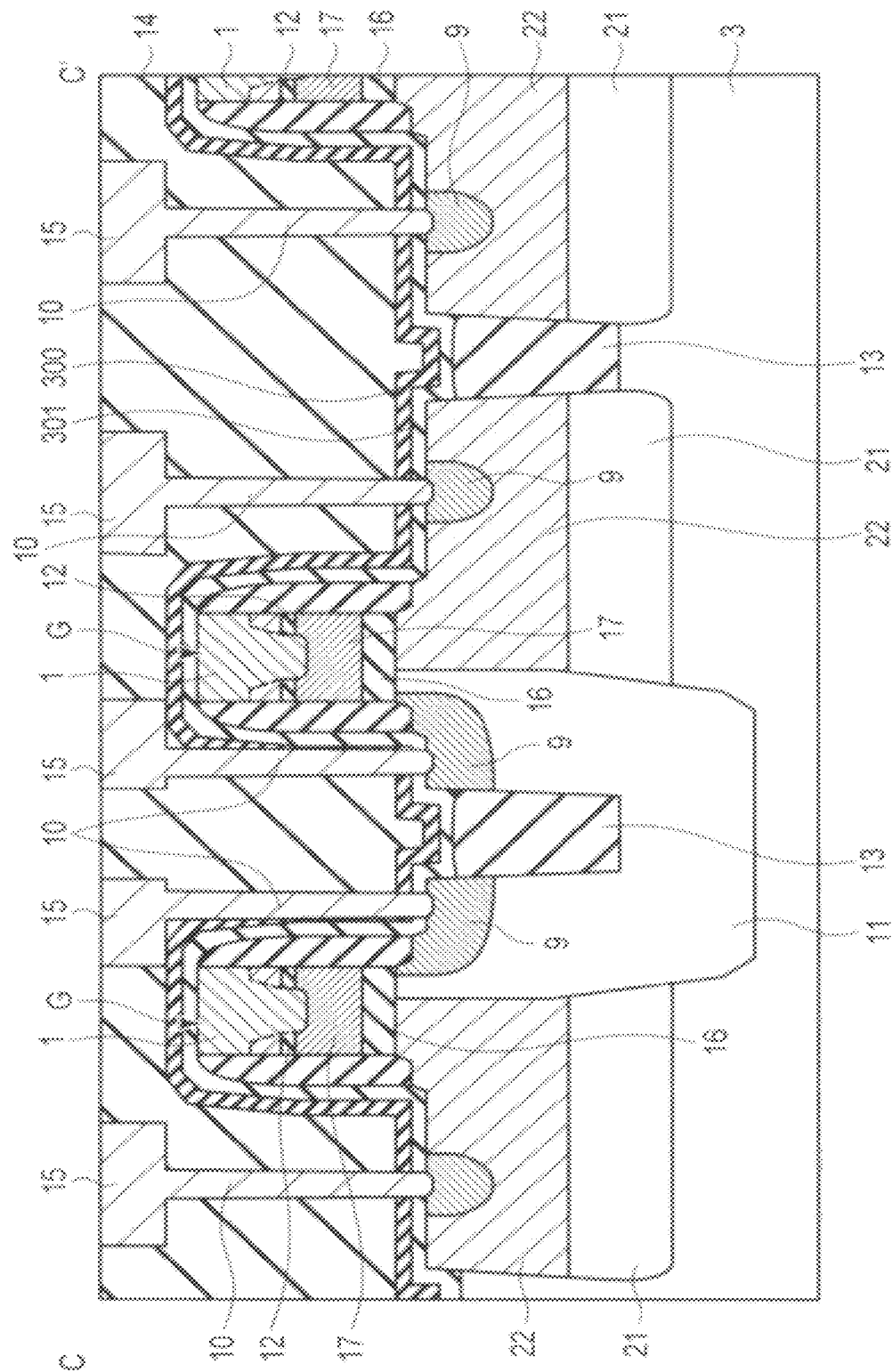
FIG. 9 is a cross-sectional view taken along line C-C' of FIG. 6.

FIG. 9 shows a cross section taken along line C-C' of FIG. 6. Since this transistor is provided at high density, the channel width of the transistor needs to be very small, on the order of 0.1 to 2 µm, for example. A problem of this transistor exists in that the junction breakdown voltage and the surface breakdown voltage on the bit line BL side decrease, and thereby the reliability decreases.

Hereinafter, embodiments will be described in detail with reference to the accompanying drawings.

(First Embodiment)

A NAND non-volatile semiconductor device of the present embodiment is shown in FIG. 1.

Figure 10:
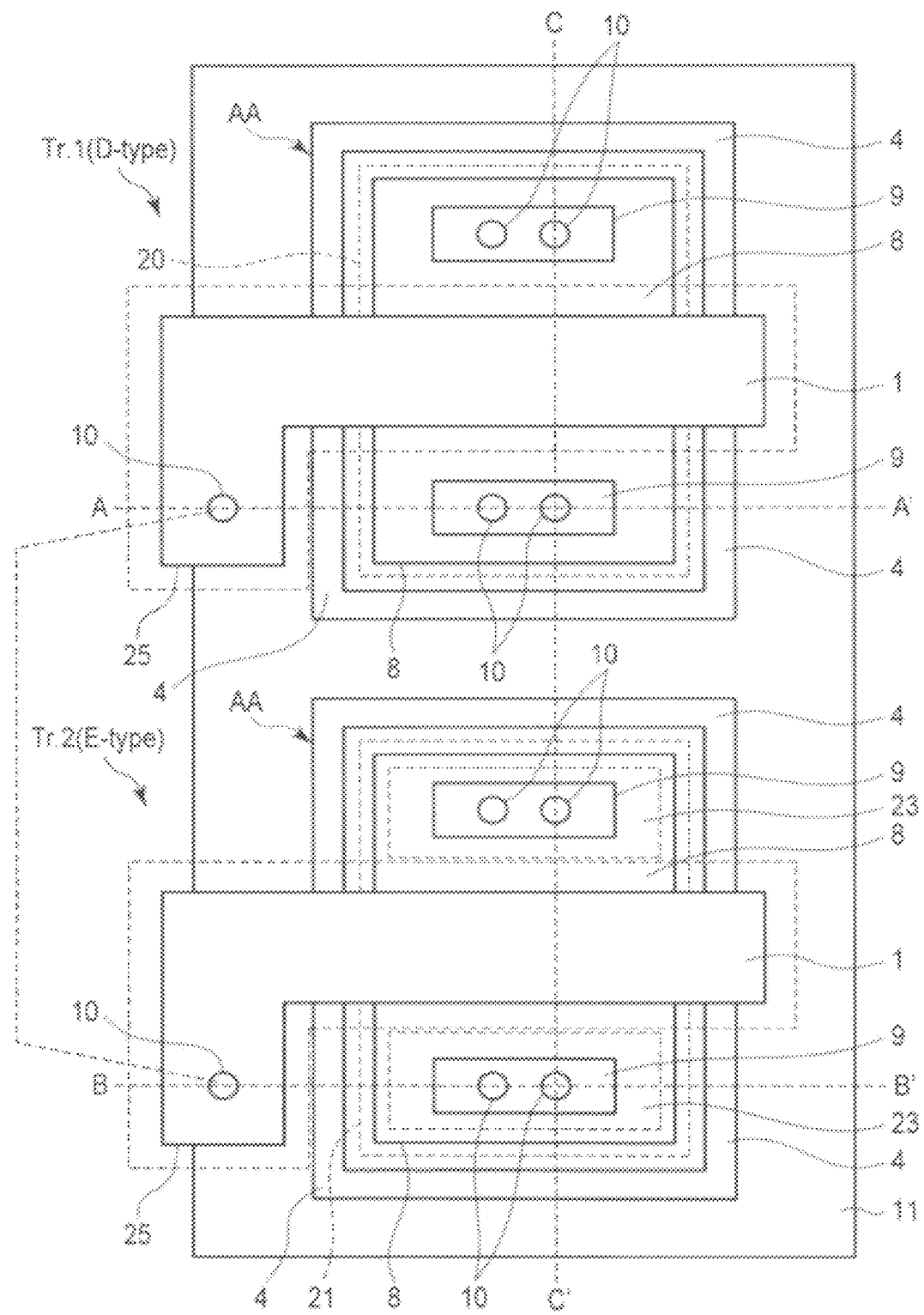
FIG. 10 is a plan view illustrating a depletion-mode high-voltage transistor and an enhancement-mode high-voltage transistor according to the first embodiment.

FIG. 10 shows a plan view of a D-type high-voltage transistor Tr.1 and an E-type high-voltage transistor Tr.2, according to the first embodiment. Hereinafter, D-type high-voltage transistor Tr.1 and E-type high-voltage transistor Tr.2 may be simply referred to as MOS transistors Tr.1 and Tr.2, respectively.

Figure 11:
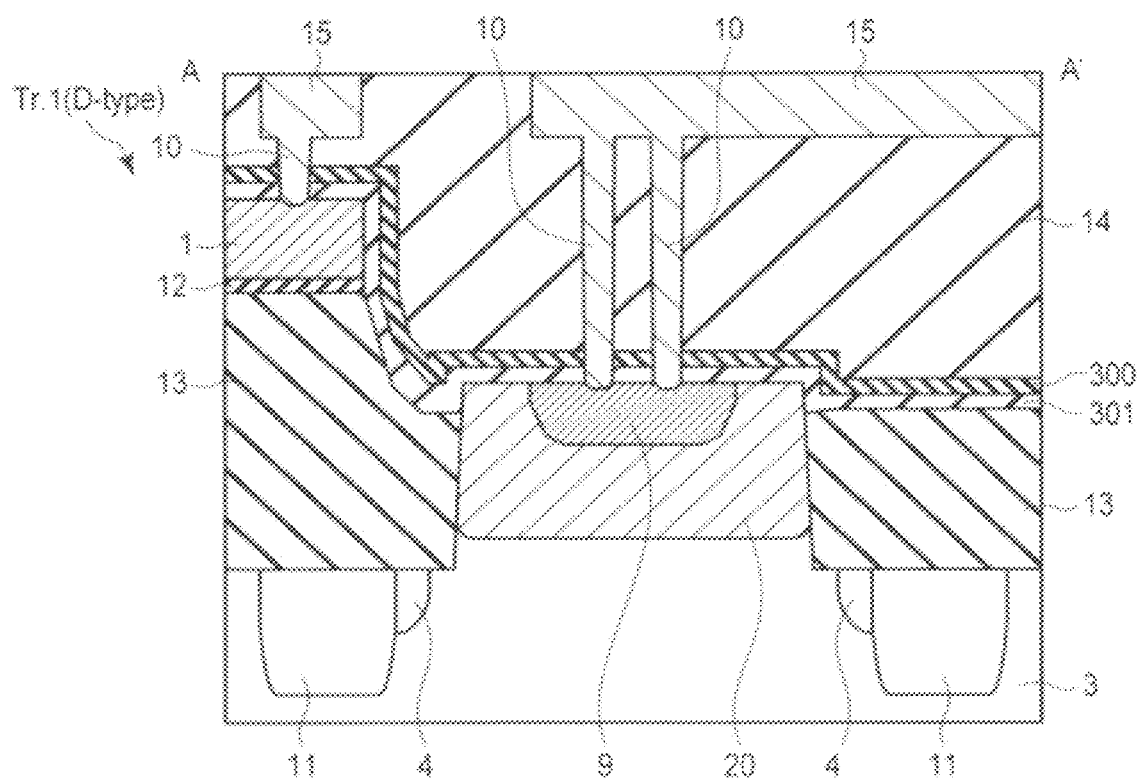
FIG. 11 is a cross-sectional view taken along line A-A' of FIG. 10.
Figure 12:
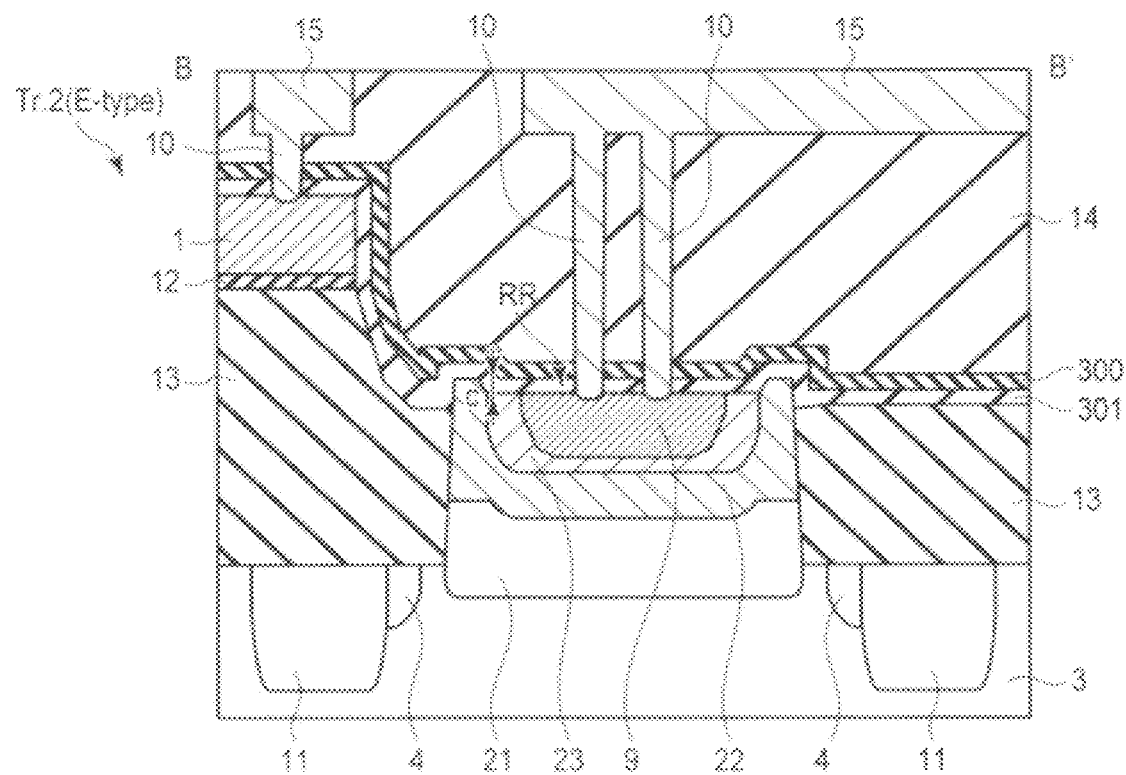
FIG. 12 is a cross-sectional view taken along line B-B' of FIG. 10.

The D-type high-voltage transistor is applied to voltage transfer circuits, such as the row decoder 403, and the E-type transistor is applied to the data control line driver 402, the connection transistor 404, and neighboring circuits thereof. For the sake of clarity in understanding, only the plane configuration of structural elements at a height less than the contact 10 is shown, and the interconnect layer is not shown in FIG. 10. FIG. 11 is a cross-sectional view taken along line A-A' of FIG. 10, and FIG. 12 is a cross-sectional view taken along line B-B' of FIG. 10, and FIG. 13 is a cross-sectional view taken along line C-C' of FIG. 10. In FIGS. 10 to 13, the same reference numbers are used to refer to structural elements same as those of FIGS. 2-5.

As shown in FIGS. 12 and 13, the first embodiment is characterized in that a hollow region RR of a depth "c" is formed in a surface of an LDD region 22 of E-type high-voltage transistor Tr.2, and that the hollow region RR is not formed on the surface of an LDD region 20 of D-type high-voltage transistor Tr.1. The depth "c" of the hollow region RR is set to 0.5 to 20 nm, for example, and the source/drain diffusion layer of Tr.2 is formed so as to correspond to the hollow region RR.

More specifically, a gate insulating film 16 is formed on a surface of a p-type semiconductor region 21 formed in the semiconductor substrate 3, and a gate electrode structure, formed of a floating gate electrode 17, a block insulating film 12, and a control gate electrode 1, is formed on the gate insulating film 16. A sidewall insulating film 25 is formed on a sidewall of the gate electrode structure. A bottom of the sidewall insulating film 25 is positioned on the gate insulating film 16. Thereby, the step height "a" shown in FIG. 5 is not formed, and a step height "b" (first hollow) is formed directly below the sidewall insulating film 25. The hollow region RR (second hollow) has a depth greater than that of the step height "b" by the depth "c".

Further, n-type impurities formed of phosphorus or arsenic, for example, are implanted into a portion below the hollow region RR along the hollow region RR. The peak concentration of the impurities is set to $10^{17}$ to $10^{19}$ cm$^{-3}$. Thereby, a region 23 is formed inside the LDD region 22 so as to have an impurity concentration higher than that of an n-type impurity concentration of the LDD region 22.

In the region 23, a high-concentration drain region 9 or a high-concentration source region 9 of E-type high-voltage transistor Tr.2 is formed. One of the contacts 10 connected to the high-concentration drain region 9 and the high-concentration source region 9 is electrically connected to a data control line (word line) of a memory cell, for example, via an interconnect 15, and transfers a gate electrode voltage necessary for writing data to, erasing data from, and reading data from the memory cell.

Further, one of the contacts 10 connected to the high-concentration drain region 9 and the high-concentration source region 9 of D-type high-voltage transistor Tr.1 is connected to a high-voltage supply node, not shown. Further, as shown in FIG. 10, the gate electrode of D-type high-voltage transistor Tr.1 is electrically connected to a gate electrode of an E-type high-voltage transistor Tr.2, for example, and forms a circuit that transfers a high voltage necessary for transferring a write voltage of E-type high-voltage transistor Tr.2.

D-type high-voltage transistor Tr.1, in which a portion including a semiconductor region below the gate electrode is formed on the p-type semiconductor substrate 3 as the n-type semiconductor region 20, is provided as a D-type high-voltage transistor having a negative threshold voltage. Since the D-type transistor is capable of transferring a voltage without causing a positive voltage drop due to the threshold voltage, the D-type transistor is also used as a level shifting circuit of a row decoder, for example.

On the other hand, E-type high-voltage transistor Tr.2, in which a portion including a semiconductor region below the gate electrode of the p-type semiconductor substrate 3 is formed as the p-type semiconductor region 21, is provided an E-type transistor having a positive threshold voltage.

In E-type high-voltage transistor Tr.2 with the above-described structure, the n$^+$ high-concentration region 23 is formed in a position at a height less than the lower surface of the gate insulating film 16 by the step height "b" and the hollow region "c", an n+ high-concentration region 9 is formed inside the region 23, and the contact 10 is connected to the region 9. Thereby, in the region 9, a creepage distance from the lower surface of the gate insulating film 16 is set to be greater than D-type high-voltage transistor Tr.1. It is thereby possible to improve the surface breakdown voltage.

Further, as will be described later, according to the present embodiment, it is possible to improve the junction breakdown voltage and the surface breakdown voltage of D-type high-voltage transistor Tr.1 and E-type high-voltage transistor Tr.2 shown in FIGS. 2 to 5. It is thereby possible to achieve a circuit with improved reliability when a high voltage is applied to a control line of the memory cell.

Further, the gate insulating film 16 is left below the sidewall insulating film 25, at a thickness of 1 to 40 nm, for example, and the step height "a", as shown in FIG. 5, is not formed. That is, a step height with the above-described thickness is formed between the top surface of the gate insulating film 16 below the sidewall insulating film 25 and the top surface of the gate insulating film 16 below the floating gate electrode 17, and the step height "a" is not formed in the semiconductor substrate 3. The above-described stepless structure can be formed by leaving the gate insulating film 16 on the semiconductor substrate 3, by means of etching by which a large selectivity is secured with respect to an oxide film, e.g., by using a mixed gases of HBr and $O_2$, when the floating gate electrode 17 is processed.

(Example of Applying E-type High-Voltage Transistor to Connection Transistor 404)

FIGS. 14 to 18 show a case where the E-type high-voltage transistor with the above-described configuration is applied to the connection transistor 404. In FIGS. 14 to 18, the connection transistor 404 is denoted by Tr.3.

Figure 14:
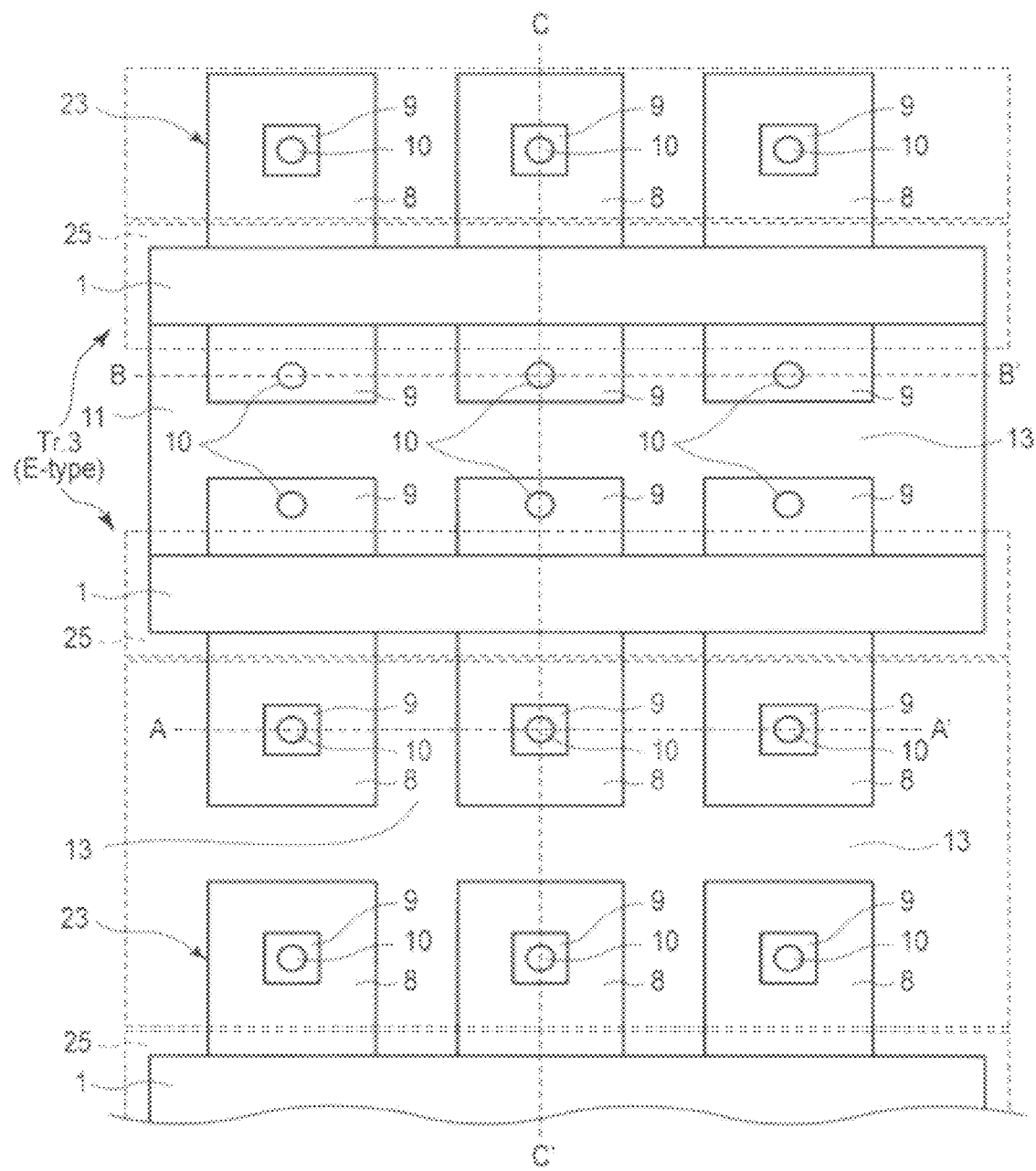
FIG. 14 is a plan view illustrating a case where the enhancement-mode high-voltage transistor of the first embodiment is applied to a connection transistor.
Figure 15:
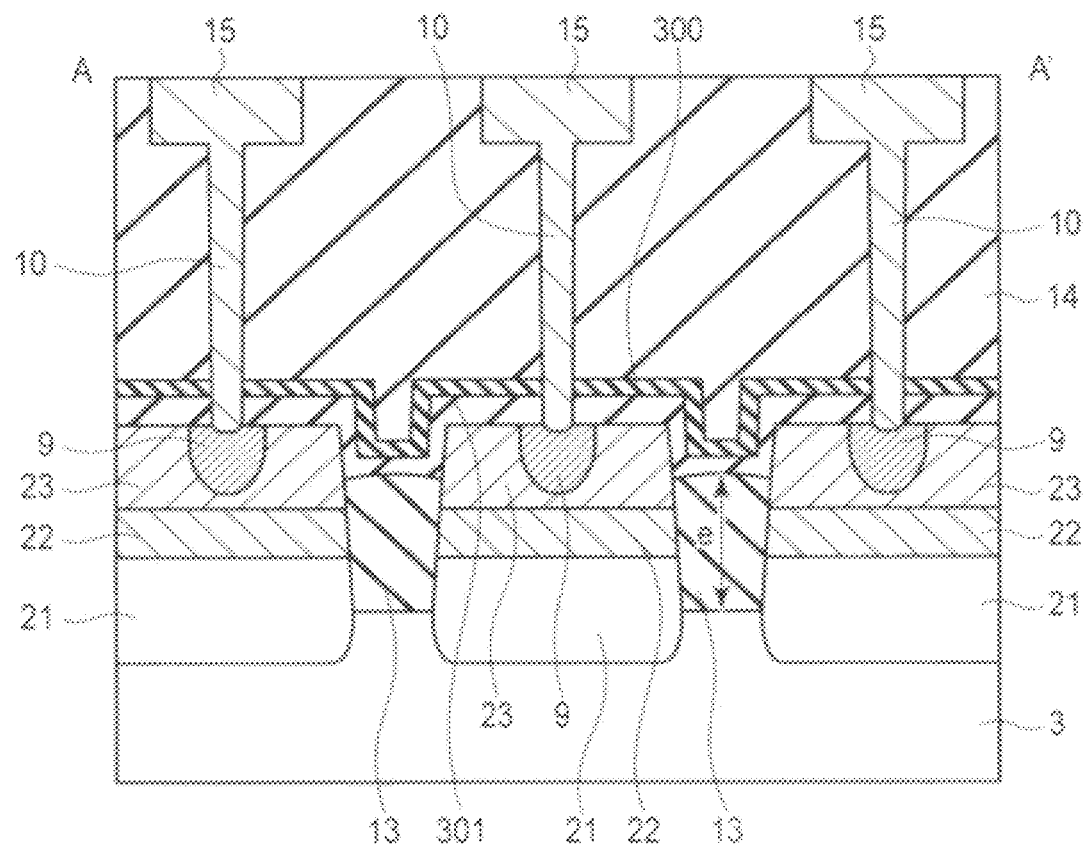
FIG. 15 is a cross-sectional view taken along line A-A' of FIG. 14.
Figure 16:
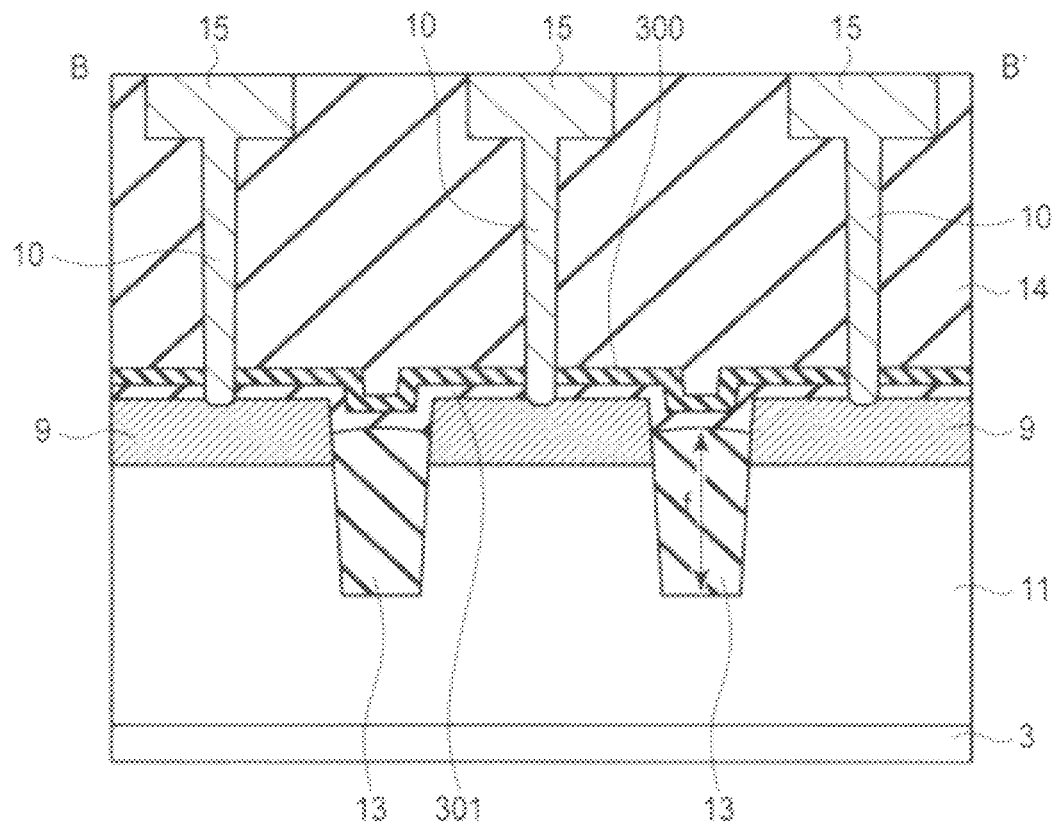
FIG. 16 is a cross-sectional view taken along line B-B' of FIG. 14.
Figure 17:
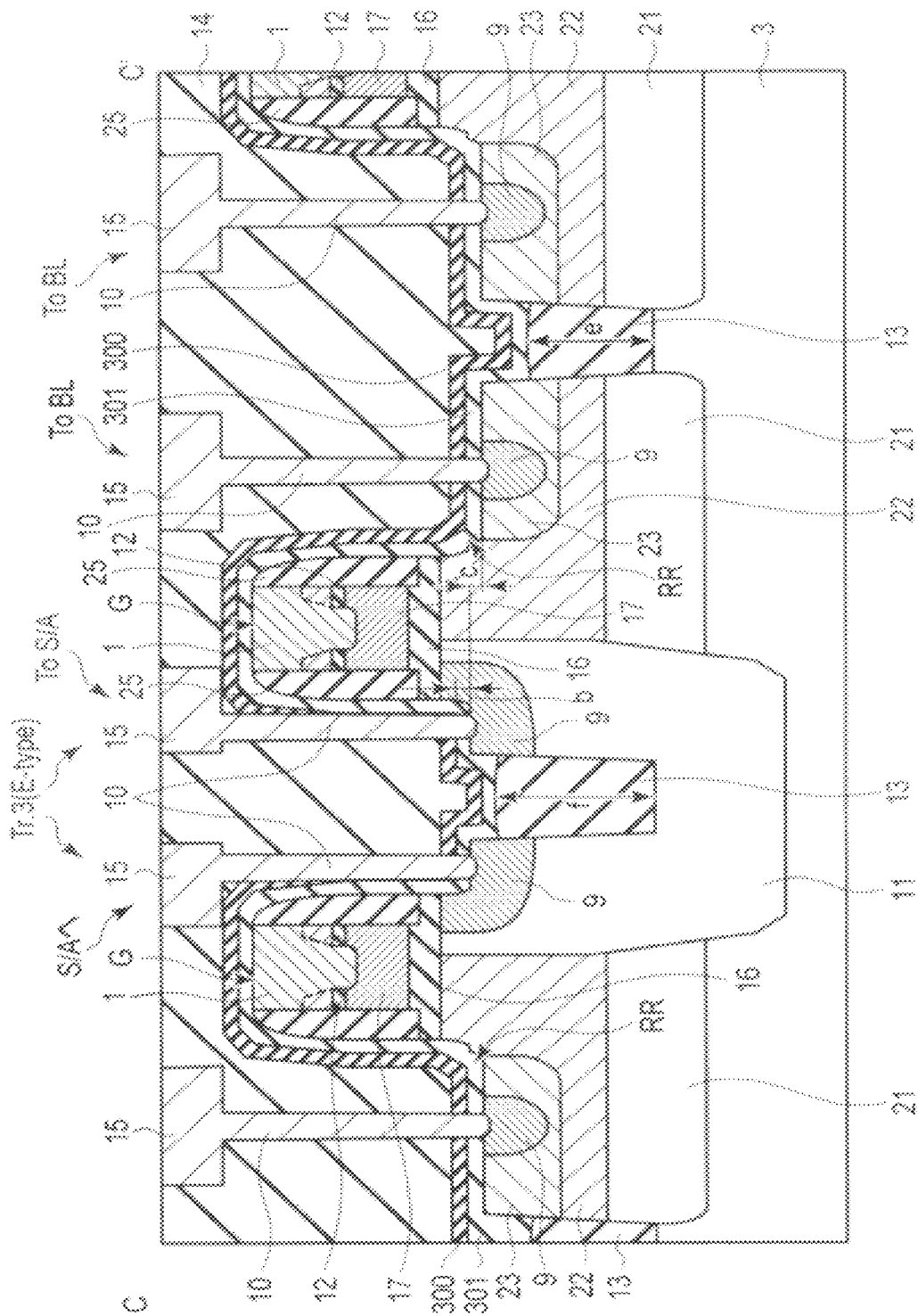
FIG. 17 is a cross-sectional view taken along line C-C' of FIG. 14.
Figure 18:
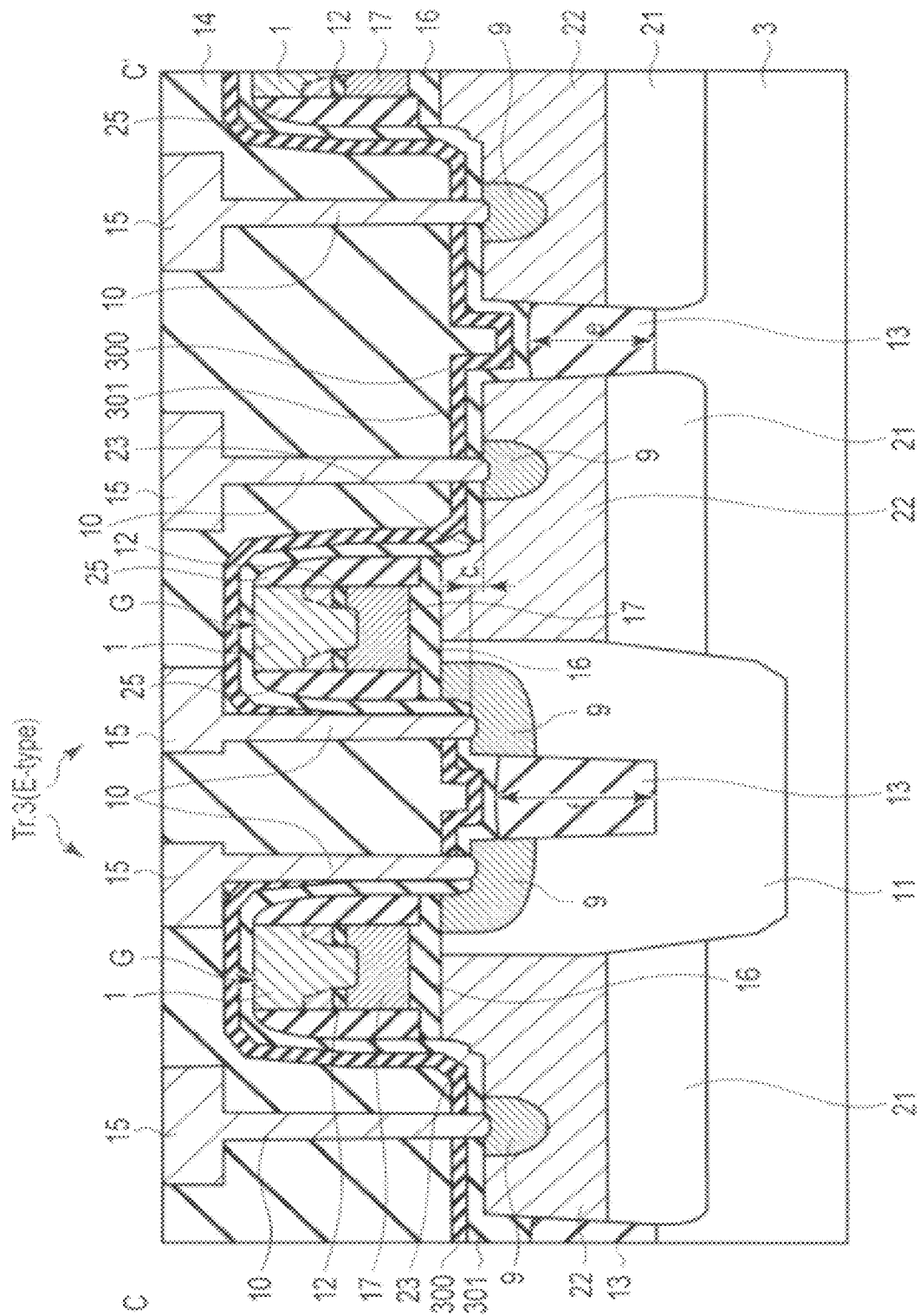
FIG. 18 is a cross-sectional view taken along line C-C' of FIG. 14, illustrating a modified example of FIG. 17.

For the sake of clarity in understanding, in FIG. 14, only the plane configuration of structural elements at a height less than the contact 10 is shown and the interconnect layer is not shown. FIG. 15 shows a cross section taken along line A-A' of FIG. 14, and FIG. 16 shows a cross section taken along line B-B' of FIG. 14, and FIG. 17 shows a cross section taken along line C-C' of FIG. 14. Further, FIG. 18 shows a modified example of FIG. 17.

The contact 10 shown in FIG. 15 is connected to a bit line (data transfer line) connected to a memory cell via an interconnect 15. The contact 10 shown in FIG. 16 is connected to a sense amplifier via the interconnect 15.

As shown in FIG. 17, a hollow region RR with a depth "c" is formed in the surface of the LDD region 22 of E-type high-voltage transistor Tr.3, as in the case of FIG. 13. The depth "c" of the hollow region RR is set to 0.5 to 20 nm, for example, and a region 23 is formed so as to correspond to the hollow region RR.

That is, inside of the LDD region 22 on the drain side, a region 23 having an impurity concentration higher than the n-type impurity concentration of the LDD region 22 is formed. Furthermore, in the region 23, a high-concentration drain region 9 having an impurity concentration higher than that of the region 23 is formed.

The LDD region, the hollow region "c", and the region 23 are not formed on the source side of E-type high-voltage transistor Tr.3. The high-concentration region 9 on the source side is formed so as to extend from a lower portion of the sidewall insulating film 25 to an element isolation region 13, in a punch-through stopper 11, in correspondence with a side surface of the gate electrode structure.

As shown in FIG. 18, the region 23 may not be formed in the LDD region 22, and a high-concentration drain region 9 or a high-concentration source region 9 of E-type high-voltage transistor Tr.3 may be formed in the LDD region 22.

As shown in FIG. 17, a gate electrode 17 is formed via a gate insulating film 16 on an element region (AA) partitioned by an element isolation (STI) region 13 of the semiconductor substrate 3. The gate insulating film 16 has a film thickness of 13 to 40 nm, for example, and is formed of a silicon oxide film or a silicon oxynitride film. By setting the film thickness of the gate insulating film 16 to be greater than or equal to 13 nm, it is possible to suppress occurrence of a tunneling leakage current and decrease in reliability of the transistor even if a high voltage is applied to between the gate electrode 17 and the element region AA.

The gate electrode has a stacked structure, as in the case of the memory cell, and is simultaneously formed with the stacked gate electrode of the memory cell. That is, the gate electrode structure includes a first conductive layer (floating gate electrode) 17 formed on the gate insulating film 16, a block insulating film 12 formed on the first conductive layer 17, and a second conductive layer 1 formed on the block insulating film 12. The block insulating film 12 includes an opening, and the first conductive layer 17 and the second conductive layer 1 are electrically connected via the opening.

The first conductive layer 17 is formed simultaneously with the floating gate electrode of the memory cell using the same material. That is, the first conductive layer 17 is formed of conductive polycrystalline silicon to which boron, phosphorus or arsenic is implanted at a concentration of $10^{18}$ to $10^{21}$ cm$^{-3}$, for example. The film thickness of the first conductive layer 17 is set to 10 to 500 nm, for example.

As in the case of the floating gate electrode, the first conductive layer 17 is formed in the element region (AA) partitioned by the element isolation (STI) region 13, and the both ends of the first conductive layer 17 extending along the width direction of the gate electrode contact the insulating film 13 of the element isolation (STI) region. The gate electrode structure of the present embodiment is formed as will be described below, for example.

(Method of Manufacturing Gate Electrode of D- and E-type High-Voltage Transistors [1])

An exemplary method of manufacturing a gate electrode of D- and E-type high-voltage transistors will be described, with reference to FIGS. 10 to 17.

First, on the surface of the semiconductor substrate 3, a resist pattern including an opening is formed by means of lithography, so as to correspond to a region in which D-type high-voltage transistor Tr.1 is to be formed. Using the resist pattern as a mask, arsenic or phosphorus ions, for example, are implanted into the semiconductor substrate 3 at an acceleration voltage of 10 to 100 keV, such that the concentration falls within the range of $10^{11}$ to $10^{13}$ cm$^{-2}$. Thereby, the D-type impurity region 20 is formed.

After that, on the surface of the semiconductor substrate 3, for example, a resist pattern including an opening is formed by means of lithography, so as to correspond to a portion in which E-type high-voltage transistors Tr.2, Tr.3 are to be formed. Using the resist pattern as a mask, boron or indium ions, for example, are implanted into the semiconductor substrate 3 at an acceleration voltage of 10 to 200 keV, such that the concentration falls within the range of $10^{11}$ to $10^{13}$ cm$^{-2}$. Thereby, the E-type impurity region 21 is formed.

Next, a gate insulating film 16 of MOS transistors Tr.1, Tr.2, and Tr.3 are formed, and a gate insulating film of a memory transistor is formed in the memory cell region simultaneously.

Next, polycrystalline silicon, which is to form the floating gate electrode and the first conductive layer 17, is deposited on the entire surface. The polycrystalline silicon layer and the gate insulating film are patterned, and the semiconductor substrate 3 is etched to a depth of 0.1 to 0.3 µm, for example, and thereby a trench is formed.

After that, an insulating material, e.g., a silicon oxide film, is buried in the trench and an element isolation region STI is formed.

According to the above-described manufacturing method, it is possible to form a floating gate electrode and a first conductive layer 17 on a stepless plane.

The block insulating film 12 is formed using the same process and the same material as the insulating film provided between the gate electrodes of the memory cell transistor, for example. The material for the block insulating film 12 is a silicon oxide film, an oxynitride film, or a multi-layered film of a silicon oxide film, a silicon nitride film, and a silicon oxide film, having a thickness of 5 to 30 nm, for example. Alternatively, a single-layered film of either of $Al_2O_3$, $HfSi_x$, $AlSi_x$, $HfAlO_x$, $HfO_x$ and $TiO_x$ or a multi-layered film of at least one of them and a high-dielectric-constant film, such as a silicon oxide film, a silicon nitride film, and a silicon acid nitride film.

The second conductive layer 1 is formed using the same process and the same material as the control gate electrode 16 of the memory cell transistor, for example. The material for the second conductive layer 1 is either a conductive polycrystalline silicon layer to which phosphorus, arsenic or boron is implanted at a concentration of $10^{17}$ to $10^{21}$ cm$^{-3}$, for example, a stack film of tungsten silicide (WSi) and a polycrystalline silicon layer, a stack film of W, WN, NiSi, MoSi, TiSi, CoSi and a polycrystalline silicon layer, or an NiSi, MoSi, TiSi, or CoSi film. The thickness of the second conductive layer 1 is 10 to 500 nm, for example.

As in the case of the control gate electrode of the memory cell transistor, a silicon oxide film or a silicon nitride film may be formed on the second conductive layer 1. The block insulating film 12 is partially removed, and the first conductive layer 17 and the second conductive layer 1 are connected in the removed portion. The second conductive layer 1 is formed so as to extend over the element isolation region STI astride the element region AA, with respect to the longitudinal direction of FIG. 10.

As shown in FIG. 13, in the surface region of the element region AA, an n-type impurity diffusion layer 22, which functions as an LDD region of the source and drain of each of D-type high-voltage transistor Tr.1 and E-type high-voltage transistors Tr.2, Tr.3 is provided. These diffusion layers 22 include phosphorus, arsenic or antimony, at a surface concentration of $10^{17}$ to $10^{20}$ cm$^{-3}$, for example, and the junction depth from the substrate surface is 10 to 300 nm, for example. The diffusion layer 22 is formed in a self-aligned manner with respect to the gate electrode 17.

Further, an n-type impurity diffusion layer 9 is formed in the diffusion layer 22. The diffusion layer 9 contains impurities at a concentration higher than that of the diffusion layer 22. That is, the diffusion layer 9 contains phosphorus, arsenic or antimony, for example, at a surface concentration of $10^{18}$ to $10^{22}$ cm$^{-3}$, and the junction depth from the substrate surface becomes 40 to 500 nm. Thus, the diffusion layer 9 is formed so as to have a resistance lower than that of the diffusion layer 22. As described above, the diffusion layer 9 is necessary in order to reduce the contact resistance with respect to the source and drain, and has a peak impurity concentration of $10^{20}$ to $10^{22}$ cm$^{-3}$, whereas the LDD region 22 has a peak impurity concentration of $10^{17}$ to $10^{19}$ cm$^{-3}$. Further, in a portion of the semiconductor substrate 3 positioned directly below the element isolation region 13, a p-well region 11 is formed. The p-well region 11 is provided so as to prevent punch-through between the element regions AA isolated by the element isolation region provided directly above the p-type well region 11. It is therefore necessary to make the resistance of the p-type well region 11 sufficiently lower than that of the semiconductor substrate 3. The depth of the well region 11 is 0.5 to 3 µm from the surface of the semiconductor substrate 3, for example, and the peak concentration of impurities contained in the well region 11 is $10^{16}$ to $10^{18}$ cm$^{-3}$. A peak of the depth is approximately 1 µm from the surface of the semiconductor substrate 3, and ranges from 0.5 to 3 µm, for example. An end of the well region 11 is isolated from an end of the element isolation region 13.

In a portion of the semiconductor substrate 3 positioned directly below the element isolation region 13, a p-well region 4 is formed so as to be adjacent to the well region 11. The p-well region 4 is provided so as to prevent a punch-through leak current from flowing in the vicinity of a bottom portion of the element isolation region 13. The depth of the well region 4 from the bottom surface of the element isolation region 13 is 0 to 0.5 µm, for example, and the peak concentration of impurities contained in the well region 4 is $10^{16}$ to $10^{18}$ cm$^{-3}$. A peak of the depth is approximately 0.1 µm from the bottom surface of the element isolation region, for example. The well region 4 is provided so as to be closer to the element region AA than the well region 11. An end of the well region 11 is isolated from the end of the isolation region STI within the range of 0.1 to 2 µm.

In the above-described structure, when the p-type well 11 is formed and punch-through between the element regions AA can be prevented, the p-type well region 4 may be omitted.

MOS transistors Tr.1, Tr.2, Tr.3 are formed of the diffusion layers 9, 22, the gate insulating film 16, the first conductive layer 1, the second conductive layer 17, and the block insulating film 12.

The insulating film 301 of TEOS or SiO$_2$, for example, is deposited on the entire surface of the semiconductor substrate 3 including MOS transistors Tr.1, Tr.2, Tr.3, within the range of 1 to 30 nm, for example. After that, an insulating film 300 of SiN, SiON or Al$_2$O$_3$, for example, is deposited within the range of 1 to 50 nm, for example. Further, on the entire surface, an interlayer insulating film 14 of TEOS, SiO$_2$, PSG or BPSG, for example, is deposited within the range of 50 to 500 nm.

The insulating film 300 functions as an etching stopper when a contact hall is formed in the thick interlayer insulating film 14. Accordingly, by using etching conditions in which selectivity of the insulating film 300 is greater than that of the interlayer insulating film 14, for example, the etching height is made flush in the insulating film 300. After that, by performing additional etching on the insulating film 301, a contact hall for forming the contact 10 is formed.

Further, the insulating film 300 interrupts hydrogen, water, or hydroxyl ions supplied to the cell via the interlayer insulating film 14 of SiO$_2$, and thereby secures high reliability of the cell.

Further, in the interlayer insulating film 14, the contact 10 is formed so as to reach the diffusion layer 9 and the gate electrode 1, which is to be the second conductive layer. The contact 10 is formed by burying a conductive material in a contact hall that reaches the diffusion layer 9 and the gate electrode 1, which is to be the second conductive layer, from the surface of the interlayer insulating film 14. The size of the contact hall is greater than or equal to 20 nm and less than or equal to 200 nm in diameter, for example. The conductive material used to bury the contact hall is either polycrystalline silicon to which phosphorous or arsenic is implanted, or a metal layer of W or Cu, and a barrier metal layer of Ti, TiN or TaN, for example.

Further, in the surface of the interlayer insulating film 14, the metal interconnect layer 15 is formed. The metal interconnect layer 15 is connected to the contact 10. The metal interconnect layer 15 is formed by a method as will be described below. First, in the surface of the interlayer insulating film 14, a groove, which is to be the metal interconnect layer 15, of greater than or equal to 50 nm and less than or equal to 500 nm, for example, is formed.

After that, a barrier metal layer of Ti, TiN or TaN, for example, is formed in the groove. The metal interconnect layer 15 is completed by burying W or Cu in the groove. Alternatively, the metal interconnect layer 15 may be formed by depositing W or Cu, for example, on the entire surface of the interlayer insulating film 14, and then etching the surface in desired pattern by means of reactive ion etching (RIE), for example.

The present embodiment may also be applied to a non-volatile semiconductor device of a floating gate electrode type that uses a process of etching a gate electrode to be a second conductive layer 1 and leaving a gate electrode to be a conductive layer using the same material and process as the floating gate electrode of the memory cell. In this case, the configuration of the present embodiment can be formed simultaneously using the above-described process, and the number of manufacturing steps can be decreased compared to the case where separate processes are adopted. This prevents increase in defects caused by the lithography and ion implantation steps, and thereby reliability is improved.

(Method of Manufacturing Gate Electrode of D- and E-type High-Voltage Transistors [2])

Another example of the method of manufacturing the gate electrode of D-type high-voltage transistor Tr.1, and E-type high-voltage transistors Tr.2, Tr.3 will be described with reference to FIGS. 19 to 27.

Figure 19:
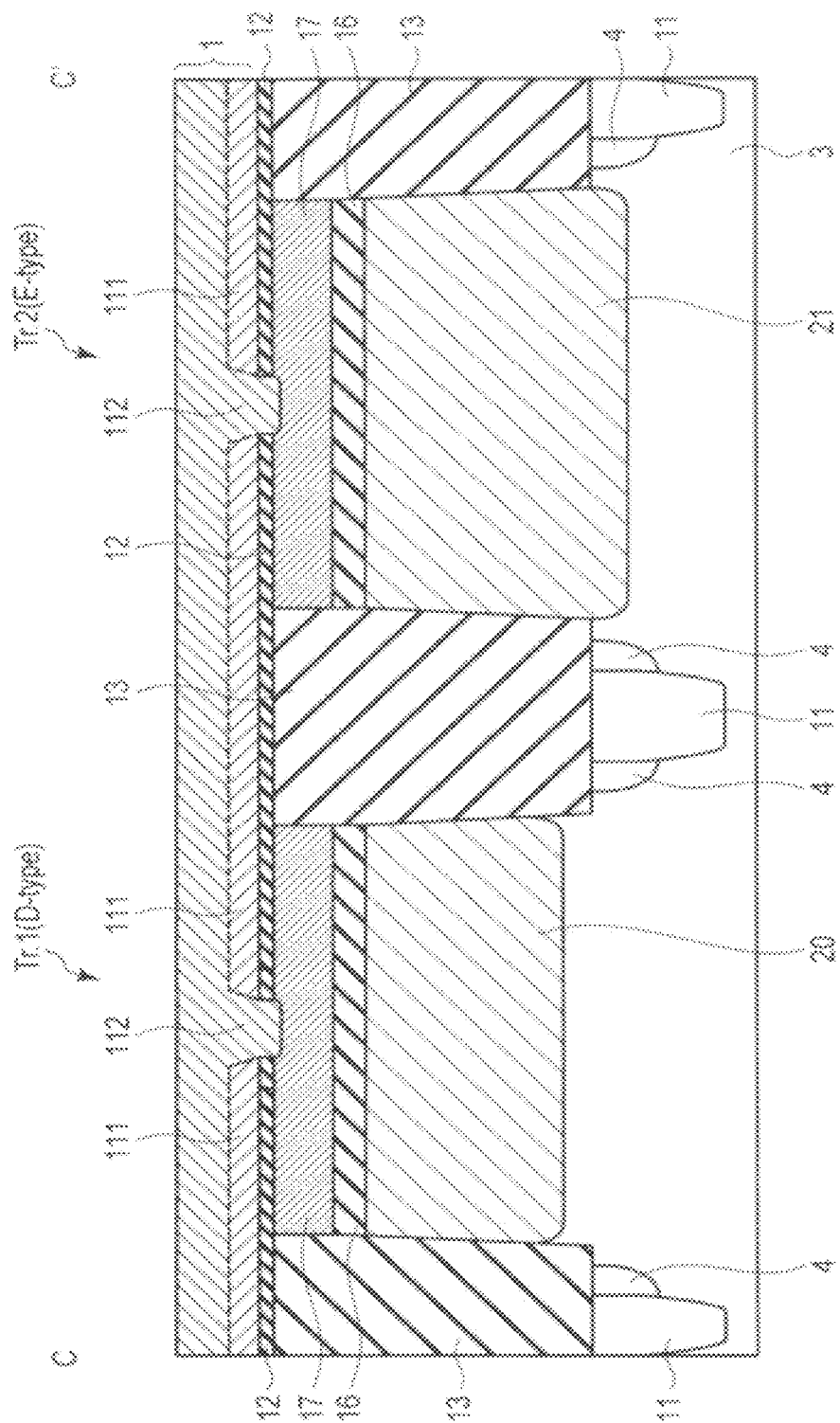
FIG. 19 is a cross-sectional view taken along line C-C' of FIG. 10, illustrating a manufacturing step of the first embodiment.
Figure 20:
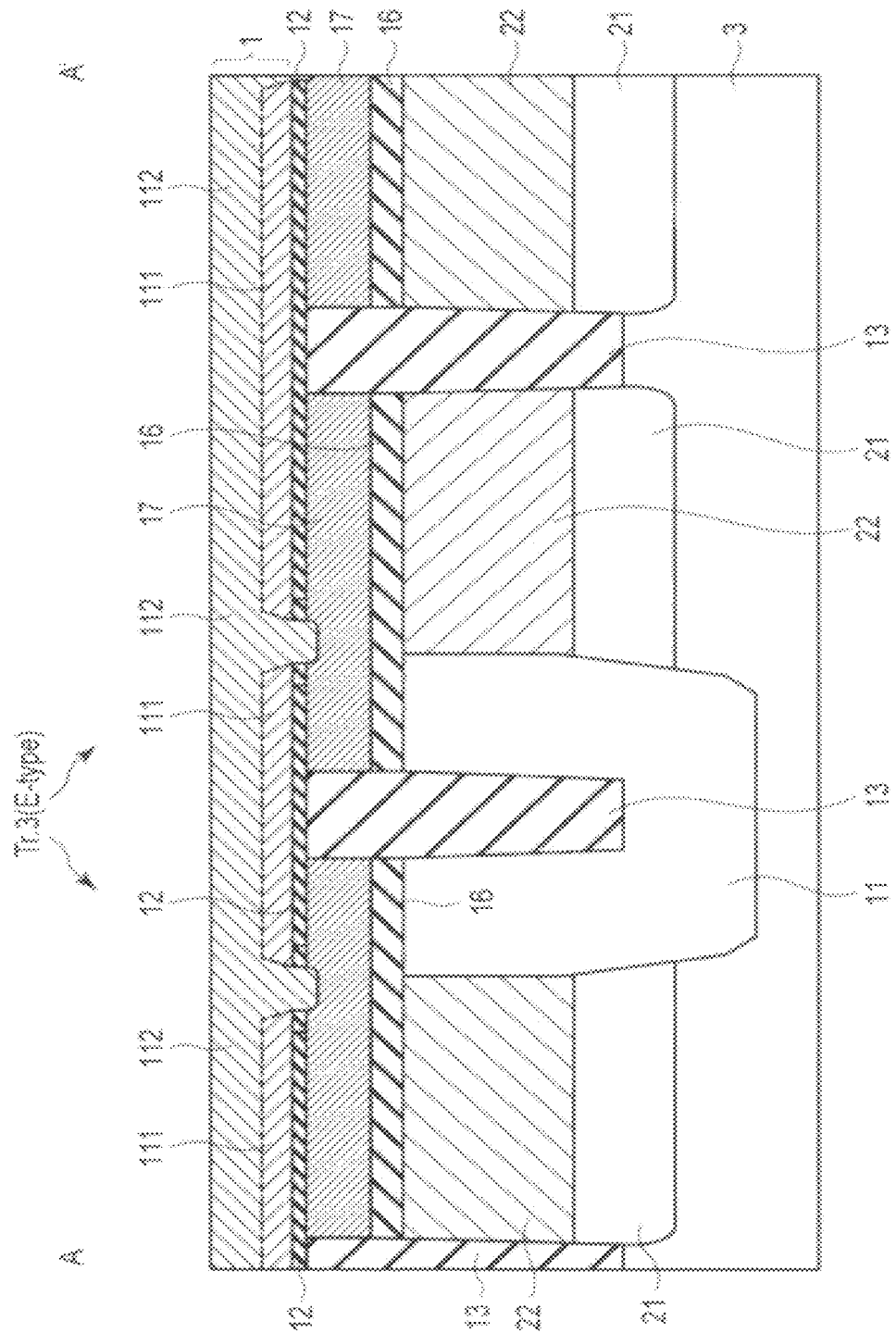
FIG. 20 is a cross-sectional view taken along line A-A' of FIG. 14, illustrating a manufacturing step of the first embodiment.

The present embodiment is characterized in formation of the gate electrode, and so a manufacturing process thereof will be described. FIG. 19 is a cross-sectional view taken along line C-C' of FIG. 10, and shows the manufacturing process of MOS transistors Tr.1, Tr.2. FIG. 20 is a cross-sectional view taken along line A-A' of FIG. 15, and shows a manufacturing process same as that of MOS transistor Tr.3 shown in FIG. 19.

FIG. 21 shows a capacitive element C formed between the first conductive layer 17 and the second conductive layer 1 interposing the block insulating film 12 in between, using the same manufacturing process same as that of FIG. 19. In manufacturing the capacitive element C, a process of selectively etching the second conductive layer 1 and leaving the first conductive layer 17 is adopted, so as to form electric separation between the first conductive layer 17 and the second conductive layer 1.

In FIGS. 19, 20 and 21, the second conductive layer 1 has an opening similar to the opening of the block insulating film 12 in the manufacturing process. That is, the second conductive layer 1 is formed of a first portion 111 formed of a polycrystalline silicon film, and having a thickness of 30 to 200 nm, and a second portion 112 formed on the first portion 111, for example. As shown by the dashed line, the second portion 112 is connected to the first conductive layer 17 via the opening made in the block insulating film 12 and the first portion 111.

That is, an n-type semiconductor region 20 and a p-type semiconductor region 21 are formed in each of the element regions AA isolated by the element isolation region 13 of the semiconductor substrate 3. The gate insulating film 16 and the first conductive layer 17 are formed on the n-type semiconductor region 20 and the p-type semiconductor region 21.

After that, the block insulating film 12 is deposited on the entire surface, and then a conductive film to be the first portion 111 of the second conductive layer 1 is deposited on the entire surface. After that, by applying a resist and then performing lithography, the first portion 111 is etched, and thereby an opening is formed. Further, the block insulating film 12 is etched using the first portion 111 as a mask, and thereby an opening is formed in the block insulating film 12, and the first conductive layer 17 is etched to a depth of 5 to 30 nm, for example.

After that, the resist is removed, and then a conductive film to be the second portion 112 of the second conductive layer 1 is deposited on the entire surface. A portion of the second portion 112 is electrically connected to the first conductive layer 17 via an opening made in the first portion 111 and the block insulating film 12. Thereby, the configuration shown in FIGS. 19, 20 and 21 is formed.

After that, an insulating film 302 formed of a silicon oxide film and/or a silicon nitride film, for example, is deposited on the entire surface. The thickness of the insulating film 302 is 10 to 400 nm, for example.

After that, a resist is deposited on the entire surface, and a resist pattern corresponding to the gate electrode and the capacitive element of the MOS transistors Tr.1, Tr.2, Tr.3 is formed. Using the resist pattern as a mask, anisotropic etching is performed on the insulating film 302, the second conductive layer 1, the block insulating film 12, and the first conductive layer 17.

Figure 22:
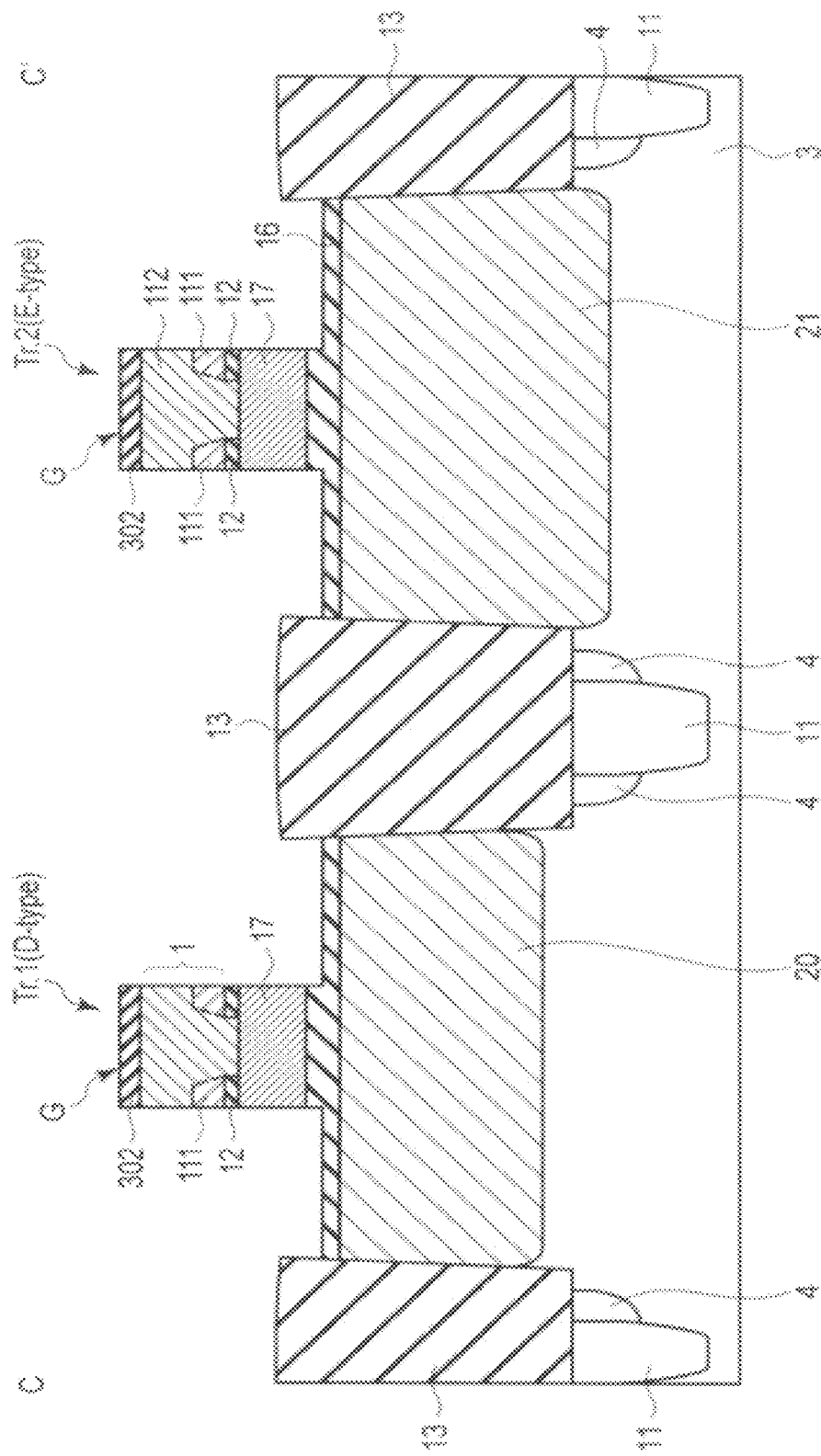
FIG. 22 is a cross-sectional view illustrating a manufacturing step following FIG. 19.
Figure 23:
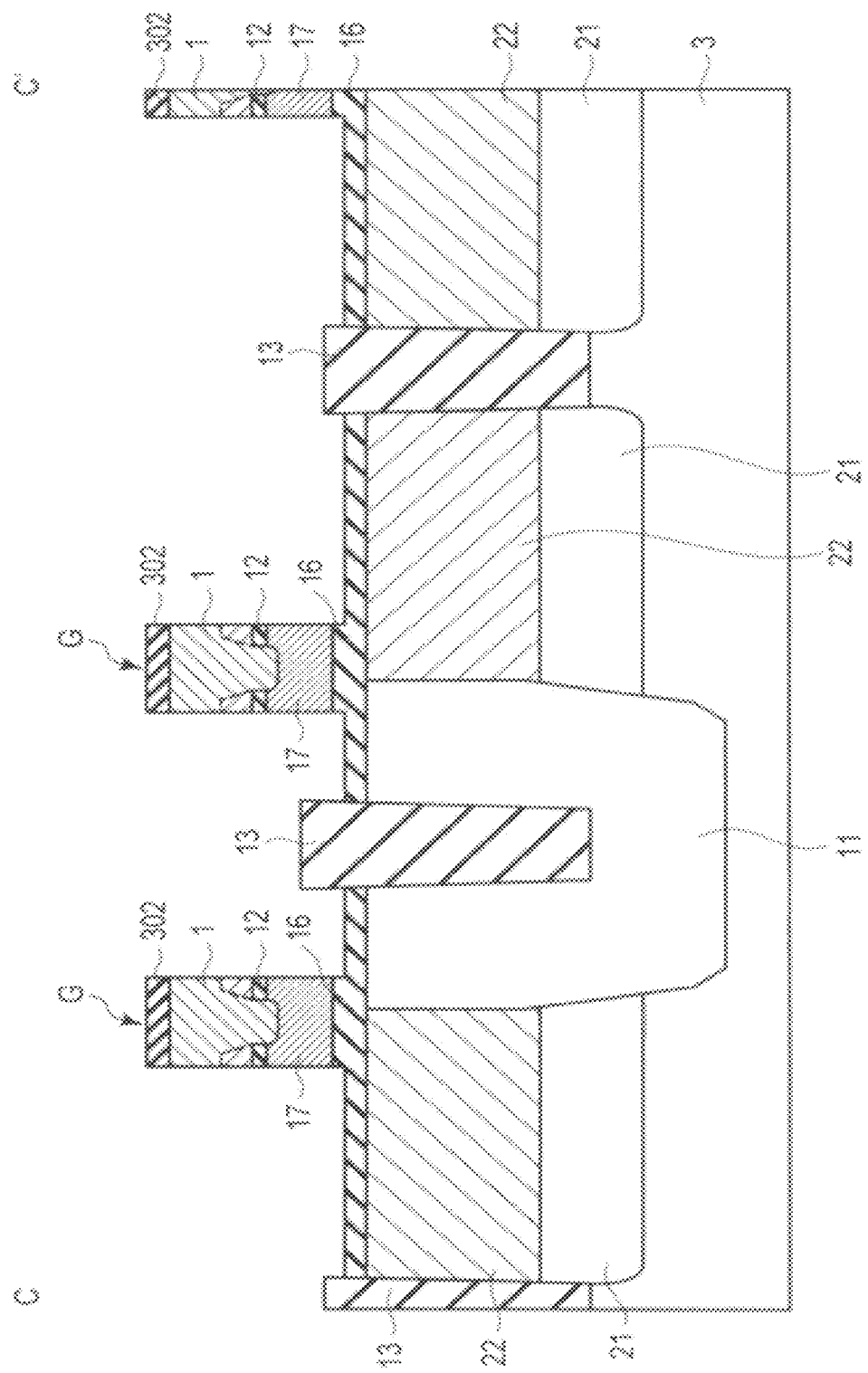
FIG. 23 is a cross-sectional view illustrating a manufacturing step following FIG. 20.
Figure 24:
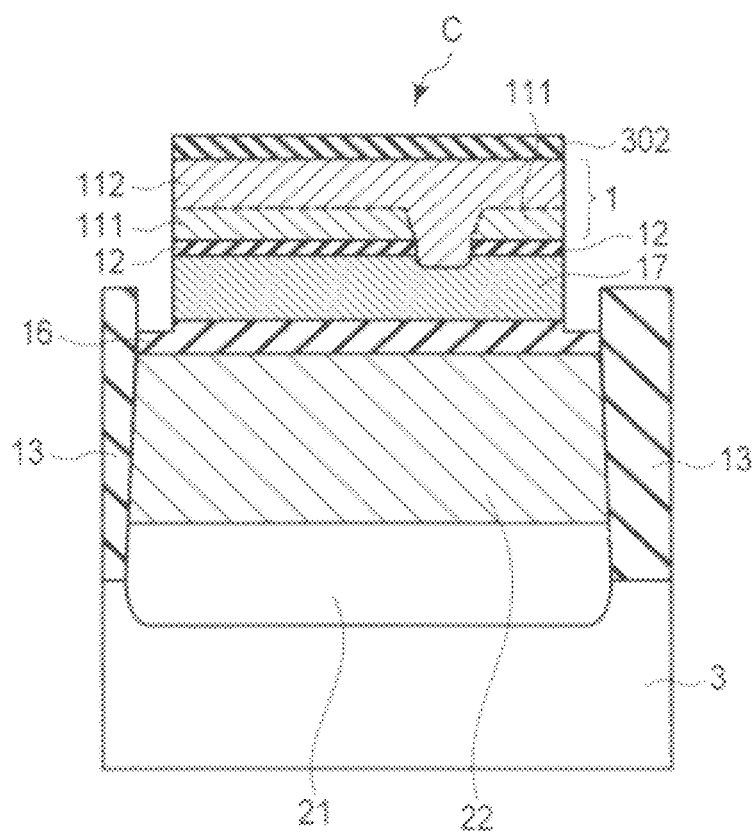
FIG. 24 is a cross-sectional view illustrating a manufacturing step following FIG. 21.

Thereby, gate electrodes of the MOS transistors Tr.1, Tr.2 are formed as shown in FIG. 22, and a gate electrode of MOS transistor Tr.3 is formed, as shown in FIG. 23. Further, a capacitive element C is formed, as shown in FIG. 24.

In this step, a portion of the surface of the gate insulating film 16 corresponding to both sides of the gate electrode G and both sides of the capacitive element C is also etched. Thereby, the gate insulating film 16 partially has a film thickness of 0.5 to 35 nm, for example.

After the step of etching the gate electrode, a step (which will be hereinafter referred to as step A) of etching only the control gate electrode 1, without etching the first conductive layer 17 as a floating gate electrode, is performed. Since step A is not the argument of the present embodiment, a detailed description will not be made.

After that, using the above-described resist pattern, boron ions are implanted at an accelerated voltage of 20 to 200 keV, such that the implantation amount falls within the range of $10^{11}$ to $10^{13}$ cm$^{-2}$. The implanted impurities will be a punch-through stopper 11 of the source/drain of the high-voltage transistor. As a matter of course, $BF_2$ may be used instead of boron, or the implantation may not be performed if punch-through may be sufficiently suppressed.

Figure 25:
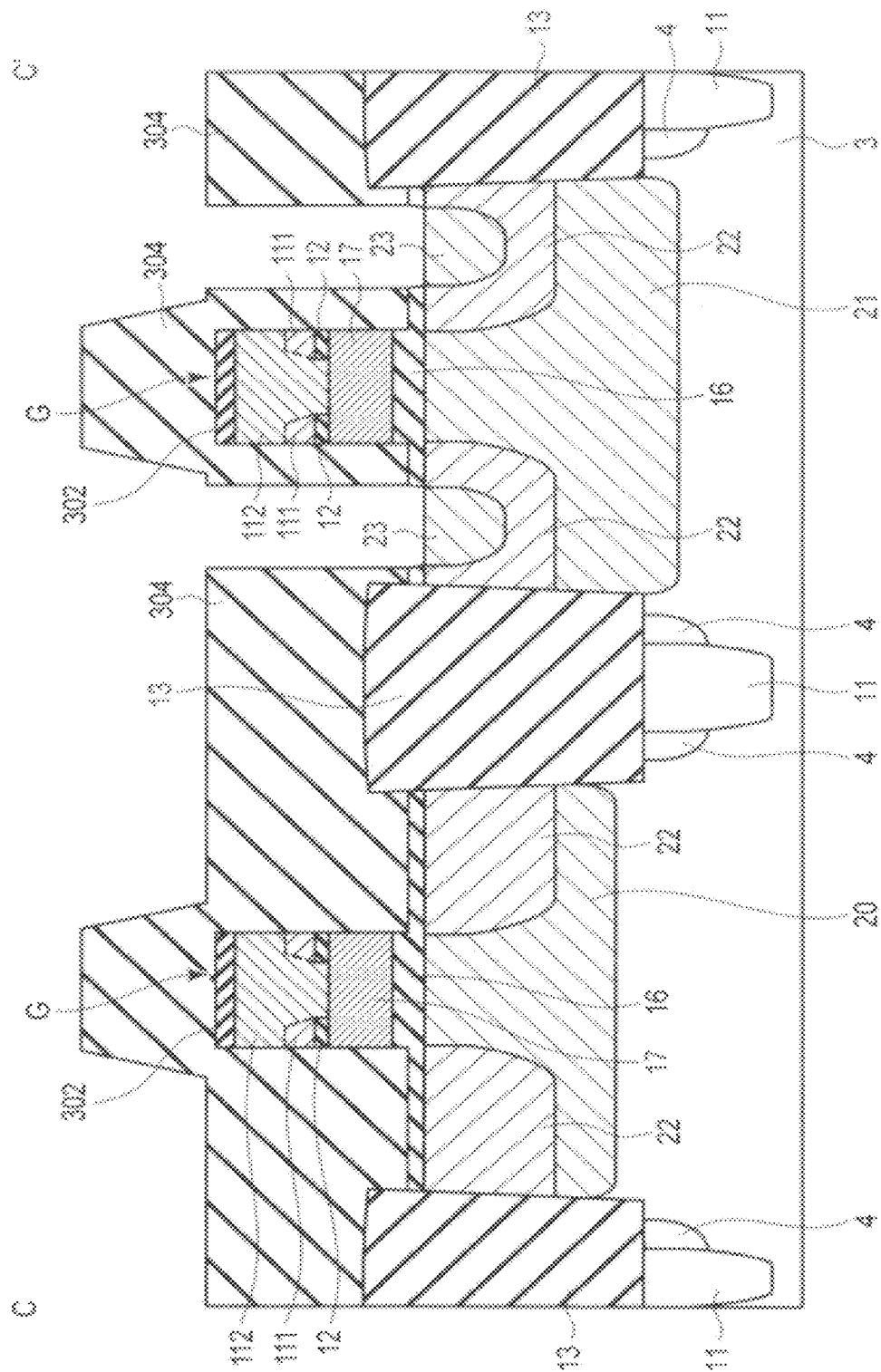
FIG. 25 is a cross-sectional view illustrating a manufacturing step following FIG. 22.
Figure 26:
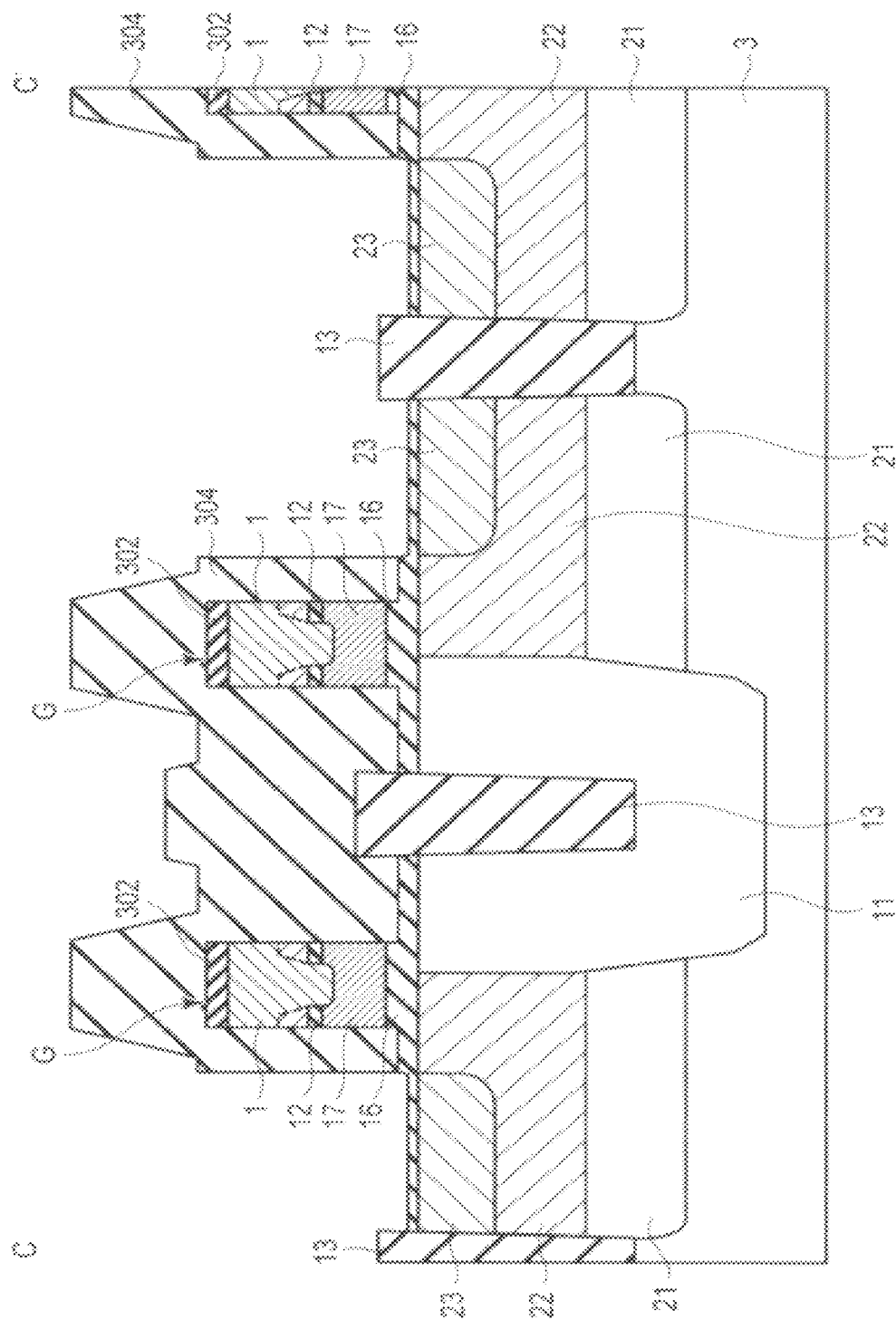
FIG. 26 is a cross-sectional view illustrating a manufacturing step following FIG. 23.

After that, as shown in FIGS. 25, 26 and 27, a resist is applied on the entire surface by a lithography step, for example, and then a resist pattern 304 including an opening in a predetermined position is formed. That is, in the resist pattern 304 shown in FIG. 25, an opening is formed in a position corresponding to the region 23 of MOS transistor Tr.2. In the resist pattern 304 shown in FIG. 26, an opening is formed in a position corresponding to the region 23 of MOS transistor Tr.3. In the resist pattern 304 shown in FIG. 27, an opening is formed in a position in which electrodes of the capacitive element C are isolated. In this step, a portion of the surface of the gate insulating film 16 corresponding to the region 23 of the semiconductor substrate 3 is etched, as shown in FIG. 25. In the etching step that follows, a hollow region RR having a depth "c" is formed according to the shape of the hollow formed in the gate insulating film 16.

After that, using the opening of the resist pattern 304, phosphorus, arsenic, or antimony ions are implanted at an acceleration voltage of 1 to 100 keV, such that the amount of implantation falls within the range of $10^{12}$ to $10^{14}$ cm$^{-2}$. In this step, a resist opening is made in the source/drain region of E-type high-voltage transistor Tr.2, and a resist opening is not formed in the source/drain region of D-type high-voltage transistor Tr.1. Accordingly, by adjusting the amount of ions to be implanted, difference in n-type concentration of the source/drain region between D-type high-voltage transistor Tr.1 and E-type high-voltage transistor Tr.2 is decreased. After that, the resist is removed by an asking process or a wet etching process using sulfuric acid.

Step A is used in a step of cutting a loop-shaped end of a gate electrode formed by sidewall processing, or a step of forming a capacitive element between the floating gate electrode and the control gate electrode shown with reference to FIGS. 21, 24 and 27. Since the amount of ions implanted into portions processed in the above-described steps can be limited to less than or equal to $10^{14}$ cm$^{-2}$, precise operation is achieved without causing an adverse effect of varying in threshold voltage, unlike a transistor.

The sidewall processing refers to a processing process of performing anisotropic etching by depositing a mask material on the sidewall of a sacrificial film on which a resist pattern is transcribed, so as to form an interconnect at a pitch double the resolution of lithography, for example. In this processing process, however, a closed and looped sidewall mask material and a gate electrode are formed in the periphery of the resist pattern. This process uses a step of etching the gate electrode, as in the gate etching step shown in FIGS. 22 to 24, but is different in that a loop-shaped end is formed at an end of the gate electrode. In order to form a separate interconnect as in the gate electrode of a memory cell, for example, it is necessary to perform lithography and processing steps, in which an end of the gate electrode is etched and isolated. For that purpose, it is necessary to perform a step (step A) of etching only the control gate electrode 1, without etching the first conductive layer 17 as a floating gate electrode, after the step of processing the sidewall of the gate electrode.

In the present embodiment, on the other hand, as shown in FIGS. 19 to 27, a step same as step A may be commonly used in formation of the region 23 in Tr.2 and Tr.3, and it is thereby possible to decrease the number of steps and reduce the manufacturing cost, compared to the case where the steps are performed individually.

Figure 28:
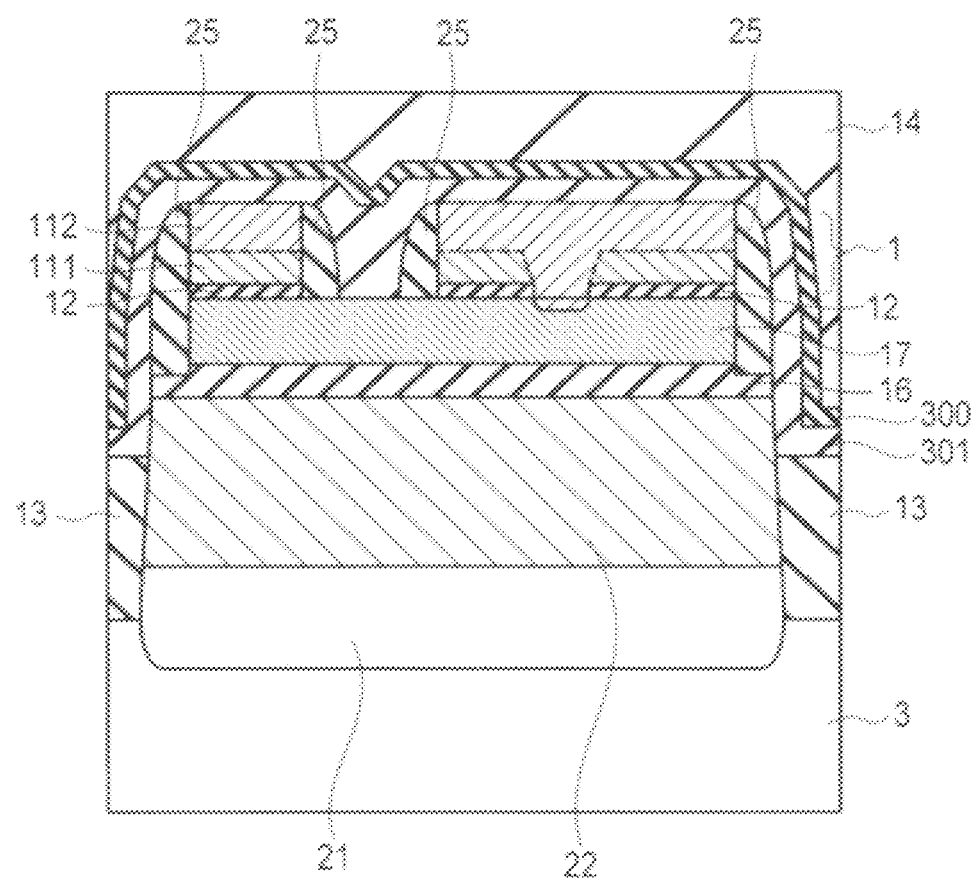
FIG. 28 is a cross-sectional view illustrating a manufacturing step following FIG. 27.

FIG. 28 shows a step following FIG. 27, and shows a state in which the sidewall insulating film 25, the insulating films 301, 300, and the interlayer insulating film 14 are formed in the capacitive element.

Figure 29:
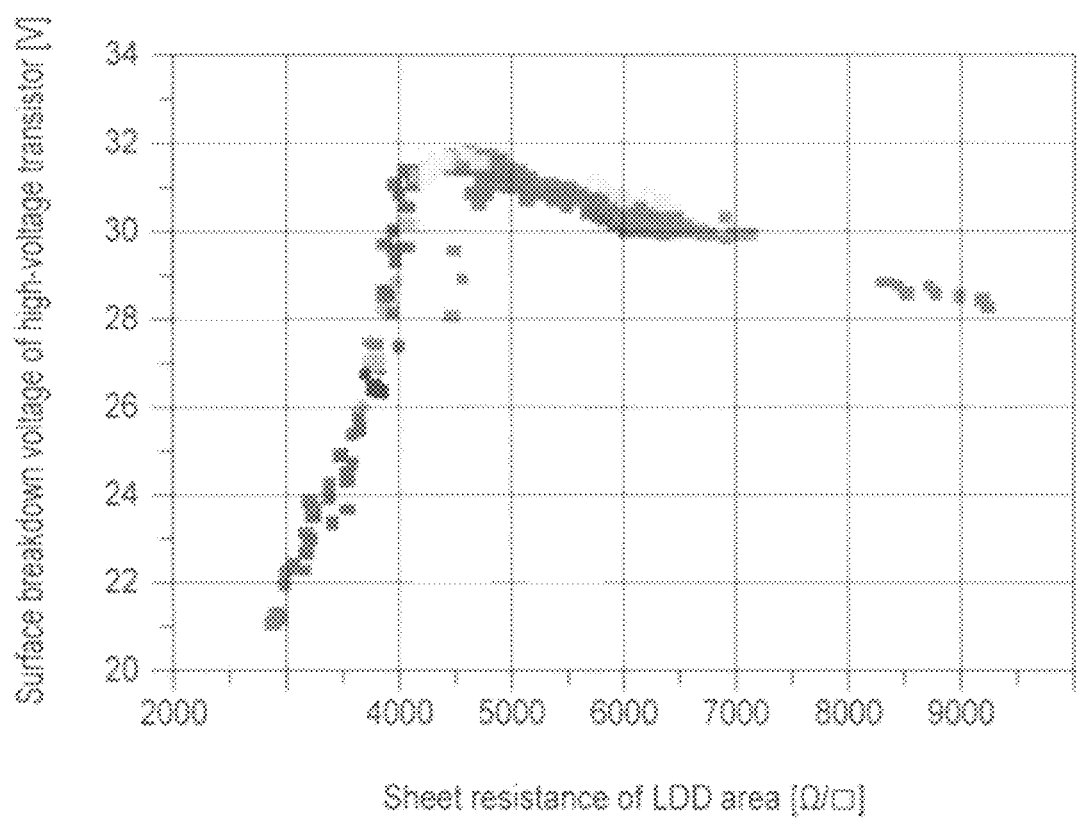
FIG. 29 illustrates a relationship between a surface breakdown voltage of a high-voltage transistor and a sheet resistance of an LDD area.

Further, the present inventors have found that the surface breakdown voltage of the transistor has a maximum with respect to the sheet resistance of the LDD region of the high-voltage transistor, and that a strong correlation exists between the sheet resistance of the LDD region and the surface breakdown voltage of the transistor, as shown in FIG. 29.

More specifically, as shown in FIG. 29, the sheet resistance of the LDD region of the high-voltage transistor has a peak value of approximately 4500 Ω/□. When the sheet resistance is lower than the peak value, it becomes difficult to deplete the LDD region. Hence, when the high-voltage is supplied to the drain electrode, the LDD region is depleted and the voltage is lowered, thereby, the voltage of a current node immediate below edge of the gate electrode is lowered than the drain voltage. On the other hand, when the sheet resistance of the LDD region is lower than the peak value, the voltage of the current node immediate below edge of the gate electrode is raised, and an electric field between the gate electrode and the current node immediate below edge of the gate electrode and an electric field of the LDD region are increased. Thereby, the surface breakdown voltage is deteriorated.

When the sheet resistance is higher than the peak value, on the other hand, the impurity concentration of the source/drain becomes smaller, and the surface breakdown voltage and the junction breakdown voltage decrease. Further, since the impurity concentration of the source/drain is low, when a positive high-voltage stress is applied to the drain, a negative charge is accumulated in the insulating film above the source/drain, and thereby a problem arises that the resistance value increases and the drain current deceases. Therefore, in order to secure sufficient surface breakdown voltage or junction breakdown voltage with respect to the sheet resistance of the source/drain region, it is necessary to limit the upper limit and the lower limit of the sheet resistance of the source/drain region to a certain range. More specifically, the sheet resistance value is set within the range of 4 to 6.5 Ω/□, for example.

Thus, according to the present embodiment, difference in sheet resistance value of the LDD region of the source/drain region between D-type high-voltage transistor Tr.1 and E-type high-voltage transistor Tr.2 is decreased, and it is thereby possible to form a transistor in which the breakdown voltage of the source/drain voltage is improved.

Further, when the sheet resistance value of the LDD region is set to an appropriate range and the surface breakdown voltage and the junction breakdown voltage are high, the transistor has a margin in breakdown voltage. It is thereby possible to suppress the problem that a negative charge is accumulated in the insulating film above the source/drain and thereby the resistance increases, when a positive high-voltage stress is applied to the drain.

After that, using the resist pattern 304, boron ions are implanted at an acceleration voltage of 20 to 200 keV, such that the amount of implantation falls within the range of $10^{11}$ to $10^{13}$ cm$^{-2}$, for example. This becomes a punch-through stopper of the opening of the source/drain of E-type high-voltage transistors Tr.2, Tr.3. As a matter of course, $BF_2$ may be used instead of boron, or the implantation may not be performed if punch-through can be sufficiently suppressed. The step of implanting boron or $BF_2$ may be performed after forming a sidewall insulating film, which will be described later.

After that, phosphorus, arsenic, antimony ions are implanted at the acceleration voltage of 1 to 100 keV, such that the implantation amount falls within the range of $10^{12}$ to $10^{14}$ cm$^{-2}$, for example. Thereby, as shown in FIG. 25, the LDD region 22 of the source/drain of E-type high-voltage transistors Tr.2, Tr.3 is simultaneously formed. The step of implanting phosphorus, arsenic, or antimony ions may be performed after forming a sidewall insulating film, as will be described below.

After that, a resist is removed by an ashing process or a wet etching process using sulfuric acid.

After that, a silicon oxide film is deposited on the entire surface, so as to have a thickness of 5 to 100 nm, and anisotropic etching is performed thereon by a depth corresponding to this thickness. Thereby, the sidewall insulating film 25 is formed on the sidewall of the gate electrode structure. The gate insulating film 16 left on the semiconductor substrate 3 is etched by the etching step by which the sidewall insulating film 25 is formed, and thereby the surface of the semiconductor substrate 3 is exposed. In this step, the semiconductor substrate 3 is dug down by a depth "b".

Further, a portion of the surface of the semiconductor substrate 3 corresponding to the region 23 is etched, and a hollow region RR having a depth "c" is formed.

After that, a resist is applied on the entire surface by a lithography step, for example, and then a resist pattern including an opening in a predetermined position is formed. That is, an opening is formed in a position corresponding to the element isolation region 13. This resist application step may be omitted if ion implantation is performed in a low-voltage transistor, for example, which will be described later, formed on the same semiconductor substrate.

After that, boron ions, for example, are implanted at an acceleration voltage of 20 to 200 keV, such that the implantation amount falls within the range of $10^{11}$ to $10^{13}$ cm$^{-2}$. This becomes a punch-through stopper of the opening of the source/drain of both the D- and E-type high-voltage transistors. As a matter of course, boron may be replaced with $BF_2$, or the ion implantation step may be omitted so as the decrease the number of steps if punch-through can be sufficiently suppressed. Further, the step of implanting boron or $BF_2$ may be performed before the gate electrode is processed and the resist 304 is applied.

After that, using the above-described resist pattern, phosphorus, arsenic, or antimony ions are implanted at an acceleration voltage of 1 to 100 keV, such that the implantation amount falls within the range of $10^{12}$ to $10^{14}$ cm$^{-2}$. This is a step of forming a source/drain electrode of the high-voltage transistor. The above-described ion implantation is performed in a self-aligned manner on both of the source/drain region of E-type high-voltage transistor Tr.2, Tr.3 and the source/drain region of D-type high-voltage transistor Tr.1, using the second conductive layer 1 of the gate electrode as a mask. Accordingly, the optimum breakdown voltage can be selected by adjusting the amount of ions to be implanted into D-type high-voltage transistor Tr.1. Further, the step of implanting phosphorus, arsenic, or antimony ions may be performed before the gate electrode is processed and the resist 304 is applied.

Next, a high-concentration drain region 9 or a high-concentration source region 9 is formed in the region 23 of E-type high-voltage transistor Tr.2. At the same time, a high-concentration drain region 9 or a high-concentration source region 9 is formed in the LDD region 22 of D-type high-voltage transistor Tr.1. In this step, after a resist is applied on the entire surface, a resist pattern including an opening in a position of the high-concentration drain region 9 or the high-concentration source region 9 is formed, for example. After that, phosphorus, arsenic, or antimony ions are implanted within the range of 5 to 100 keV, such that the implantation amount falls within the range of $10^{14}$ to $10^{16}$ cm$^{-2}$, for example. Thereby, an n-type high-concentration region 9 is formed so as to keep the low-resistance contact.

After that, the insulating film 301 formed of TEOS or an $SiO_2$ film, for example, is deposited on the entire surface within the range of 1 to 30 nm. After that, an insulating film 300 formed of SiN, SiON, or $Al_2O_3$, for example, is deposited within the range of to 50 nm. Moreover, the interlayer insulating film 14 is formed on the entire surface.

According to the above-described configuration of the present embodiment, it is possible to form a film formed of a thermal oxide film or a radical oxide film, and having favorable insulating characteristics that cause less traps than a deposited insulating film, under the floating gate electrode 17 and below the sidewall insulating film 25. It is thereby possible to suppress deterioration of the gate insulating film caused by a stress in the vicinity of the end of the gate electrode. Accordingly, when 0 V is applied to the gate electrode and a high voltage is applied to the drain electrode, for example, electrons are accumulated in the gate insulating film 16 and the sidewall insulating film 17 due to increase in electric field of the end of the gate electrode, and thereby the problem of increase in threshold voltage in the high-voltage transistor is suppressed.

The portion of the high-voltage gate insulating film 16 on the semiconductor substrate 3 having a film thickness of 0.5 to 30 nm, for example, is etched in the step of etching the sidewall gate insulating film and transcribed into the semiconductor substrate 3, and a step height "b" having a depth of 0.5 to 30 nm, for example, is transcribed, as shown in FIG. 13. The hollow region RR needs to be separated from the gate electrode 1 by a distance of greater than or equal to 0.1 μm.

This is because the gate electrode prevents etching due to a gap in alignment in lithography when the hollow region RR is formed.

Further, by forming the region 23 so as to surround the n+ high-concentration region 9, inclination of the n− concentration from the region 9 to the LDD region 22 can be can be decreased. It is therefore possible to prevent a steep change in junction electric field, and to improve the junction breakdown voltage. Accordingly, the opening of the resist pattern in which the region 23 is to be formed should desirably be formed outside the n+ region 9 apart therefrom by approximately 0.1 μm, considering an alignment gap in the mask.

Further, as shown in FIG. 18, the channel width of E-type high-voltage transistor Tr.3 is set within the range of 0.1 to 2 μm, for example. Accordingly, in order to suppress decrease in junction breakdown voltage and surface breakdown voltage of E-type high-voltage transistor Tr.3 of the element region AA having a small width, the hollow region RR provided in the source/drain connected to the bit line BL between adjacent transistors Tr.3 is also formed on the element isolation region 13.

In the present embodiment, the isolation width is set within the range from 0.1 to 1.0 μm, for example.

It is thereby difficult to provide a border of lithography for forming the hollow region RR. In this case, the hollow region RR needs to be separated from the gate electrode by greater than or equal to 0.1 μm, such that the gate electrode will not be etched by a gap in alignment in lithography.

Further, by forming the hollow region RR so as to surround the n+ high-concentration region 9, inclination of the n− concentration with respect to the LDD region 22 can be made smaller than that of the region 9. Thereby, the junction breakdown voltage is improved. Further, the hollow region RR should desirably be formed outside the region 9 so as to be separated therefrom by greater than or equal to 0.1 μm, considering a gap in mask alignment.

Further, as shown in FIG. 18, assuming that the height of the upper surface of the element isolation region 13 between the source/drain regions to which the contact 10 connected to the bit line BL is connected is "e", the height "e" is lower than the height "f" of the upper surface of the element isolation region 13 between the source/drain regions to which the contact 10 connected to the sense amplifier S/A is connected 10 to 100 nm, for example, as a result of the etching step in which the hollow region RR is formed. Thus, even if the height of the element isolation region 13 decreases, since the n+ high-concentration region 9 of the source/drain region connected to the contact connected to the bit line BL is formed so as to be separated from the boundary between the semiconductor region and the element isolation region 13 by 0.1 to 1 μm, for example, it is possible to prevent impurity ions for forming the n+ high-concentration region 9 from being implanted into the element isolation region 13.

Further, it is possible to decrease the height of the element isolation region 13 surrounding the source/drain region connected to the contact 10 connected to the bit line BL. Therefore, when high density plasma (HDP)-$SiO_2$, non-silicate glass (NSG) or polysilazane (PSG) is used as an insulating film, for example, it is possible to reduce a stress applied to the semiconductor substrate, and thereby generation of crystal defects may be suppressed.

Further, as in the case of E-type high-voltage transistor Tr.2, the hollow region RR of E-type high-voltage transistor Tr.3 needs to be separated from the gate electrode by greater than or equal to 0.1 μm, so as to prevent the gate electrode from being etched.

Further, by forming the hollow region RR so as to surround the n+ high-concentration region 9, inclination of the n− concentration with respect to the LDD region 22 can be made smaller than the region 9. It is therefore possible to improve the junction breakdown voltage. Further, the hollow region RR should desirably be formed outside the region 9, so as to be separated therefrom by greater than or equal to 0.1 μm, considering a gap in mask alignment.

In E-type high-voltage transistor Tr.3 as the connection transistor 404, the sheet resistance value of the source/drain LDD region 22 may be made flush with D-type high-voltage transistor Tr.1 and E-type high-voltage transistor Tr.2. Therefore, a transistor in which the breakdown voltage of the source/drain voltage is improved can be formed.

Further, when a positive high-voltage stress is applied to the drain, a negative charge is accumulated in the insulating film above the source/drain. Since a transistor having a high surface breakdown voltage and junction breakdown voltage has a margin in breakdown voltage, the problem that resistance of the LDD region increases due to charge accumulation can be suppressed.

In the above-described embodiment, the case of a NAND flash memory has been described as an example.

The present embodiment, however, may be applied to a 3 Tr-NAND flash memory, obtained by setting the number of memory cell transistors to one in a NAND flash memory, or a NOR flash memory, for example. Further, the present embodiment may also be applied to a 2 Tr flash memory, obtained by removing a selective transistor on the drain side from a 3 Tr-NAND flash memory, and is widely applicable to non-volatile semiconductor memories including a stacked gate electrode structure.

According to the present embodiment, it is possible to decrease the number of steps, decrease the source resistance or the drain resistance of the high-voltage transistor, and increase the reliability life of the high-voltage transistor, by implanting n-type impurity ions on the source/drain electrode of the gate insulating film of a high-voltage transistor including a gate insulating film with a thickness greater than that of the gate insulating film of the memory cell, using a step of isolating the control gate electrode formed by sidewall processing.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A non-volatile semiconductor memory device, comprising:
    a memory cell array including a plurality of data control lines and a plurality of data transfer lines formed on a semiconductor substrate, and a plurality of memory cells selected by the data control line and the data transfer line; and
    a transistor formed on the semiconductor substrate, the transistor including:
    a gate insulating film formed on the semiconductor substrate and having a thickness greater than a thickness of a gate insulating film of the memory cell;
    a gate electrode on the gate insulating film;

a sidewall insulating film formed on both side surfaces of the gate electrode;

a source diffusion layer formed in a portion of the semiconductor substrate corresponding to one side of the gate electrode, and connected to a sense amplifier via a contact;

a first hollow formed in a position at a height less than a bottom surface of the gate insulating film, directly below an outer side surface of the sidewall insulating film on another side of the gate electrode;

a second hollow formed in the first hollow at a position at a height less than the first hollow; and a drain diffusion layer formed in a portion of the semiconductor substrate corresponding to another side of the gate electrode, the drain diffusion layer including a low-concentration drain region formed on a bottom surface of the second hollow and a high-concentration drain region surrounded by the low-concentration drain region and connected to the data transfer line via a contact.

2. The device according to claim 1, further comprising:

a first element isolation insulating film provided adjacent to the drain diffusion layer of the transistor; and a second element isolation insulating film provided adjacent to the source diffusion layer of the transistor, wherein a height of an upper surface of the first element isolation insulating film is less than a height of an upper surface of the second element isolation insulating film.

3. The device according to claim 2, wherein a height of a top surface of the high-concentration drain region of the transistor is less than a height of a top surface of the source diffusion layer of the transistor.

4. The device according to claim 2, wherein the height of the upper surface of the first element isolation insulating film is less than the upper surface of the second element isolation insulating film by a depth of 10 to 100 nm.

5. The device according to claim 3, wherein the transistor is an enhancement-mode transistor, and the height of the high-concentration drain region of the transistor is less than the height of the top surface of the source diffusion layer of the transistor by 0.5 to 30 nm.

6. A non-volatile semiconductor memory device, comprising:

a memory cell array including a plurality of data control lines and a plurality of data transfer lines formed on a semiconductor substrate, and a plurality of memory cells selected by the data control word line and the data transfer line;

a first transistor, comprising:
  a first gate insulating film formed on the semiconductor substrate and having a thickness greater than a thickness of a gate insulating film of the memory cell;
  a first gate electrode formed on the first gate insulating film;
  a first sidewall insulating film formed on both side surfaces of the first gate electrode;
  a first region of a first conductivity type formed in the semiconductor substrate below the first gate electrode;
  a first source diffusion region of a second conductivity type formed on one side of the first gate electrode in the first region;
  a first hollow formed in a position at a height less than a bottom surface of the first gate insulating film, directly below an outer side surface of the first sidewall insulating film on another side of the first gate electrode;
  a second hollow formed in the first hollow at a position at a height less than the first hollow; and
  a first drain diffusion region of the second conductivity type formed on another side of the first gate electrode in the first region, the first drain diffusion region of the second conductivity type including a low-concentration drain region formed on a bottom surface of the second hollow and a high-concentration drain region surrounded by the low-concentration drain region; and a second transistor comprising:
  a second gate insulating film formed on the semiconductor substrate and having a thickness equal to the thickness of the first gate insulating film;
  a second gate electrode formed on the second gate insulating film;
  a second sidewall insulating film formed on both side surfaces of the second gate electrode;
  a second region of the second conductivity type formed in the semiconductor substrate below the second gate electrode;
  a second source diffusion region of the second conductivity type formed on one side of the second gate electrode in the second region;
  a high-concentration source region of the second conductivity type formed in the second source diffusion region;
  a second drain diffusion region of the second conductivity type formed on another side of the gate electrode in the second region; and
  a high-concentration second drain region formed in the second drain diffusion region.

7. The device according to claim 6, wherein the high-concentration drain region of the first transistor is electrically connected to the data control line of the memory cell, and the second gate electrode of the second transistor is electrically connected to the first gate electrode of the first transistor.

8. The device according to claim 7, wherein the first gate electrode comprises:

a first conductive film formed on the gate insulating film;

a first insulating film formed on the first conductive film and including an opening; and a second conductive film formed on the first insulating film and electrically connected to the first conductive film via the opening, further comprising an element comprising:

a third conductive film formed of a material same as a material of the first conductive film;

a second insulating film formed on the third conductive film and including an opening;

a fourth conductive film formed on the second insulating film and electrically connected to the third conductive film via the opening;

a third insulating film formed on the third conductive film; and a fifth conductive film formed on the third insulating film so as to be isolated from the fourth conductive film.

9. A non-volatile semiconductor memory device, comprising:

a memory cell array including a plurality of data control lines and a plurality of data transfer lines formed on a semiconductor substrate, and a plurality of memory cells selected by the data control line and the data transfer line;

a first transistor of an enhancement mode; and
a second transistor of a depletion mode, the first transistor comprising:
  a first gate insulating film having a thickness greater than a thickness of a gate insulating film of the memory cell formed on the semiconductor substrate;
  a first gate electrode formed on the first gate insulating film;
  a first sidewall insulating film formed on both side surfaces of the first gate electrode;
  a first diffusion layer having a first impurity concentration formed in a portion of the semiconductor substrate corresponding to both sides of the first gate electrode;
  a first hollow formed in the first diffusion layer directly below both sides of the first sidewall insulating film, in a position at a height less than a bottom surface of the first gate insulating film;
  a second hollow formed in the first hollow at a position at a height less than the first hollow;
  a second diffusion layer formed in the first hollow and having a second impurity concentration higher than the first impurity concentration; and
  a third diffusion layer formed in the second diffusion layer, having a third impurity concentration higher than the second impurity concentration, the second transistor comprising:
  a second gate insulating film having a thickness greater than the thickness of the gate insulating film of the memory cell formed on the semiconductor substrate;
  a second gate electrode formed on the second gate insulating film;
  a fourth diffusion layer formed in a portion of the semiconductor substrate corresponding to both sides of the second gate electrode and having a fourth impurity concentration;
  a second sidewall insulating film formed on both side surfaces of the second gate electrode;
  a third hollow formed in the fourth diffusion layer directly below both sides of the second sidewall insulating film, and having a depth lower than a bottom surface of the second gate insulating film and equal to a depth of the first hollow; and
  a fifth diffusion layer formed in the third hollow, having an impurity concentration higher than the fourth impurity concentration.

10. The device according to claim 9, wherein the first gate electrode comprises:
  a first conductive film formed on the gate insulating film;
  a first insulating film formed on the first conductive film and including an opening; and
  a second conductive film formed on the first insulating film and electrically connected to the first conductive film via the opening, further comprising an element comprising:
  a third conductive film formed of a material same as a material of the first conductive film;
  a second insulating film formed on the third conductive film and including an opening;
  a fourth conductive film formed on the second insulating film and electrically connected to the third conductive film via the opening;
  a third insulating film formed on the third conductive film; and
  a fifth conductive film formed on the third insulating film so as to be isolated from the fourth conductive film.

* * * * *